United States Patent
Shin et al.

(10) Patent No.: US 12,295,103 B2
(45) Date of Patent: May 6, 2025

(54) ELECTRONIC DEVICE INCLUDING FLEXIBLE PRINTED CIRCUIT BOARD

(71) Applicant: SAMSUNG ELECTRONICS CO., LTD., Suwon-si (KR)

(72) Inventors: Kwangha Shin, Suwon-si (KR); Suk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 17/992,543

(22) Filed: Nov. 22, 2022

(65) Prior Publication Data
US 2023/0164255 A1 May 25, 2023

Related U.S. Application Data

(63) Continuation of application No. PCT/KR2022/018433, filed on Nov. 21, 2022.

(51) Int. Cl.
*H05K 1/18* (2006.01)
*H04M 1/02* (2006.01)

(52) U.S. Cl.
CPC .......... *H05K 1/189* (2013.01); *H04M 1/0277* (2013.01)

(58) Field of Classification Search
CPC ....... H05K 1/189; H05K 1/147; G06F 1/1652
See application file for complete search history.

(56) References Cited

U.S. PATENT DOCUMENTS

| | | |
|---|---|---|
| 2012/0002376 A1 | 1/2012 | Suzuki et al. |
| 2012/0043117 A1 | 2/2012 | Kato et al. |
| 2013/0062837 A1* | 3/2013 | Sasaki .............. H05K 7/00 277/650 |

(Continued)

FOREIGN PATENT DOCUMENTS

| | | |
|---|---|---|
| CN | 206136440 U | 4/2017 |
| JP | 5-327135 A | 12/1993 |

(Continued)

OTHER PUBLICATIONS

International Search Report (PCT/ISA/210) issued by the International Searching Authority on Feb. 24, 2023 in corresponding International Application No. PCT/KR2022/018433.

(Continued)

*Primary Examiner* — James Wu
(74) *Attorney, Agent, or Firm* — Sughrue Mion, PLLC

(57) ABSTRACT

An electronic device including a housing; a first printed circuit board disposed in the housing; a second printed circuit board disposed in the housing; a flexible printed circuit board configured to electrically connect the first printed circuit board to the second printed circuit board, the flexible printed circuit board including: a first connector connected to the first printed circuit board, a second connector connected to the second printed circuit board, and a bending part which extends from the first connector away from the second printed circuit board and bends to extend toward the second printed circuit board; an electrical component disposed in the housing, wherein at least a portion of the electrical component faces the flexible printed circuit board; and a buffer member disposed between a first portion of the bending part and a second portion of the bending part which faces the first portion of the bending part.

20 Claims, 16 Drawing Sheets

(56) References Cited

U.S. PATENT DOCUMENTS

| | | |
|---|---|---|
| 2016/0049240 A1 | 2/2016 | Kato |
| 2016/0198560 A1 | 7/2016 | Shin et al. |
| 2016/0216738 A1 | 7/2016 | Fukuma et al. |
| 2017/0295642 A1 | 10/2017 | Codd et al. |
| 2020/0060020 A1 | 2/2020 | Park et al. |
| 2020/0084890 A1 | 3/2020 | Jang et al. |
| 2022/0164002 A1 | 5/2022 | An et al. |

FOREIGN PATENT DOCUMENTS

| | | |
|---|---|---|
| JP | 2003-233056 A | 8/2003 |
| JP | 2006-349788 A | 12/2006 |
| JP | 2009-033681 A | 2/2009 |
| JP | 2009-186971 A | 8/2009 |
| JP | 4843726 B1 | 12/2011 |
| JP | 5071748 B2 | 11/2012 |
| JP | 2013-153229 A | 8/2013 |
| JP | 2016-139057 A | 8/2016 |
| KR | 10-2007-0005072 A | 1/2007 |
| KR | 10-2016-0085388 A | 7/2016 |
| KR | 10-2018-0069763 A | 6/2018 |
| KR | 10-2019-0003024 A | 1/2019 |
| KR | 10-2020-0021172 A | 2/2020 |
| KR | 10-2020-0028566 A | 3/2020 |
| KR | 10-2020-0101224 A1 | 8/2020 |

OTHER PUBLICATIONS

Written Opinion (PCT/ISA/237) issued by the International Searching Authority on Feb. 24, 2023 in corresponding International Application No. PCT/KR2022/018433.

* cited by examiner

ELECTRONIC DEVICE INCLUDING FLEXIBLE PRINTED CIRCUIT BOARD

CROSS-REFERENCE TO RELATED APPLICATIONS

This application is a bypass continuation application of International application No. PCT/KR2022/018433, filed on Nov. 21, 2022, which is based on and claims priority to Korean Patent Application No. 10-2021-0161246, filed on Nov. 22, 2021, in the Korean Intellectual Property Office, the disclosure of which is incorporated by reference herein in its entirety.

BACKGROUND

1. Field

The disclosure relates to an electronic device and, for example, to an electronic device including a flexible printed circuit board.

2. Description of Related Art

In line with the development of information/communication technologies and semiconductor technologies, there has been widespread use of various kinds of electronic devices at a rapid place. Electronic devices have been developed to be carried and used for communication.

Electronic devices may refer to devices configured to perform specific functions according to installed programs, such as home appliances, electronic wallets, portable multimedia players, mobile communication terminals, tablet PCs, video/audio devices, desktop/laptop computers, and vehicle navigation systems. For example, electronic devices may output stored information as sounds or images. In line with the high degree of integration of electronic devices and the widespread use of super-fast large-capacity wireless communication, it has recently become possible to equip a single electronic device (for example, mobile communication terminal) with various functions. For example, not only a communication function, but also an entertainment function (for example, gaming), a multimedia function (for example, music/video playback), communication and security functions for mobile banking and the like, a scheduling function, and an electronic wallet function may be integrated into a single electronic device. Such electronic devices have become compact such that they can be conveniently carrier by users.

Recently, portable electronic devices (for example, smartphones) may be compact and flat, and there are demands for high levels of integration and performance, such as application of latest antenna-related technologies. As a result, electronic devices have reduced inner spaces for disposing printed circuit boards, and circuit boards are thus made compact and disposed separately to be spaced apart.

Therefore, some electronic devices have a flexible printed circuit board so as to connect the printed circuit boards that are separated and spaced apart.

An electronic device (for example, smartphone or tablet PC) may include electrical components (for example, battery and camera), a printed circuit board electrically connected to the electrical components, and a flexible printed circuit board for connecting electrical components or connecting separated printed circuit boards. The flexible printed circuit board may occupy a space inside the electronic device, and may include a connector to be connected and/or fastened to printed circuit boards.

The flexible printed circuit board may be disposed adjacent to electrical components or support members inside the electronic device. When the user uses the electronic device, the electrical components or support members of the electronic device may have relative movements with reference to the housing (for example, casing) of the electronic device inside the electronic device. A specific part of the flexible printed circuit board may be pulled by the electrical components or support members, and the connector of the flexible printed circuit board coupled to the printed circuit board may be fractured or detached accordingly.

SUMMARY

Provided is an electronic device capable of reducing detachment of a connector of a flexible printed circuit board from a printed circuit board.

Also provided is an electronic device capable of limiting collision between an area of a flexible printed circuit board and another area thereof.

Problems to be solved by the disclosure are not limited to the above-mentioned problems, and may be variously expanded without deviating from the idea and scope of the disclosure.

Additional aspects will be set forth in part in the description which follows and, in part, will be apparent from the description, or may be learned by practice of the presented embodiments.

In accordance with an aspect of the disclosure, an electronic device includes a housing; a first printed circuit board disposed in the housing; a second printed circuit board disposed in the housing; a flexible printed circuit board configured to electrically connect the first printed circuit board to the second printed circuit board, the flexible printed circuit board comprising: a first connector connected to the first printed circuit board, a second connector connected to the second printed circuit board, and a bending part which extends from the first connector away from the second printed circuit board and bends to extend toward the second printed circuit board; an electrical component disposed in the housing, wherein at least a portion of the electrical component faces the flexible printed circuit board; and a buffer member disposed between a first portion of the bending part and a second portion of the bending part which faces the first portion of the bending part.

The electronic device may further include a reinforcing member coupled to a first surface of the flexible printed circuit board opposite to a second surface of the flexible printed circuit board, wherein the first connector is coupled to the second surface of the printed circuit board, and wherein the reinforcing member may include a protrusion configured to support the housing.

A thickness of the protrusion may be greater than a thickness of the flexible printed circuit board.

The protrusion may include a first protrusion and a second protrusion spaced apart from the first protrusion in a width direction of the housing, and A distance between the first protrusion and the second protrusion is greater than a width of the flexible printed circuit board.

The bending part may include: a first flat part which extends from the first connector away from the second printed circuit board, a bent part which bends from the first flat part toward the second printed circuit board, and a second flat part which extends from the bent part toward the second printed circuit board.

The buffer member may be disposed on one part from among the first flat part and the second flat part.

The second flat part may be parallel to the first flat part.

The bending part may include a first flat part which extends from the first connector away from the second printed circuit board, a bent part which bends from the first flat part toward the second printed circuit board, and a second flat part which extends from the bent part toward the second printed circuit board, and the buffer member may be disposed on a portion of the reinforcing member which faces the bent part.

The electrical component may include at least one of a battery and a camera.

A height of the buffer member may be less than a distance between the first flat part and the second flat part.

The protrusion may be formed integrally with the reinforcing member.

The protrusion may be formed separately from the reinforcing member.

The protrusion may be coupled to the reinforcing member using an attachment member.

The protrusion may pass through the reinforcing member and may be coupled to the housing.

The flexible printed circuit board may include a first inclined part which extends from the second flat part in away from the electrical component, and a third flat part which extends from the first inclined part toward the second printed circuit board.

In accordance with an aspect of the disclosure, an electronic device includes a housing; a first printed circuit board disposed in the housing; a flexible printed circuit board electrically connected to the first printed circuit board, the flexible printed circuit board comprising: a first connector coupled to the first printed circuit board, and a bending part which extends from the first connector and bends to extend toward the first connector; an electrical component disposed in the housing, and wherein at least a portion of the electrical component faces the flexible printed circuit board; a reinforcing member coupled to a first surface of the flexible printed circuit board opposite to a second surface of the flexible printed circuit board, wherein the first connector is coupled to the second surface of the flexible printed circuit board, and wherein the reinforcing member may include a protrusion configured to support the housing; and a buffer member disposed inside the bending part and adjacent to the reinforcing member.

A first surface of the reinforcing member may face in a first direction, a second surface of the reinforcing member may face in a second direction opposite to the first direction, and a movable space may be formed in at least one portion of the first surface of the reinforcing member is recessed in the second direction, and a depth of the movable space may be greater than a thickness of the flexible printed circuit board.

A width of the movable space may be greater than a width of the flexible printed circuit board.

The bending part may include: a first flat part which extends from the first connector, a bent part which bends from the first flat part toward the first connector, and a second flat part which extends from the bent part toward the first connector.

In accordance with an aspect of the disclosure, an electronic device includes a housing; a first printed circuit board disposed in the housing; a flexible printed circuit board electrically connected to the first printed circuit board, the flexible printed circuit board comprising: a first connector connected to the first printed circuit board, and a bending part which extends in a first direction from the first connector, and bends to extend in second direction opposite to the first direction; an electrical component disposed adjacent to the first printed circuit board, wherein at least a portion of the electrical component faces the flexible printed circuit board; and a buffer member disposed inside the bending part, wherein the bending part includes: a first flat part which extends substantially parallel to the first printed circuit board from the first connector, a bent part which bends to extend from the first flat part toward the first connector, and a second flat part which extends substantially parallel to the first printed circuit board from the bent part.

According to various embodiments of the disclosure, an electronic device may include multiple printed circuit boards and a flexible printed circuit board for connecting the multiple printed circuit boards or connecting a printed circuit board and an electrical component. The flexible printed circuit board may include a bending part such that, even if a partial area of the flexible printed circuit board is pulled, this can be accommodated, thereby preventing or reducing the occurrence of cracks in the flexible printed circuit board. According to various embodiments of the disclosure, an electronic device may limit detachment of a flexible printed circuit board and/or fracture of the flexible printed circuit board, thereby securing durability and reliability of the electronic device.

According to various embodiments of the disclosure, an electronic device may include a buffer member, thereby limiting or reducing excessive bending or folding of a partial area of a flexible printed circuit board.

Advantageous effects obtainable from the disclosure are not limited to the above-mentioned advantageous effects, and other advantageous effects not mentioned herein will be clearly understood by those skilled in the art to which the disclosure pertains.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
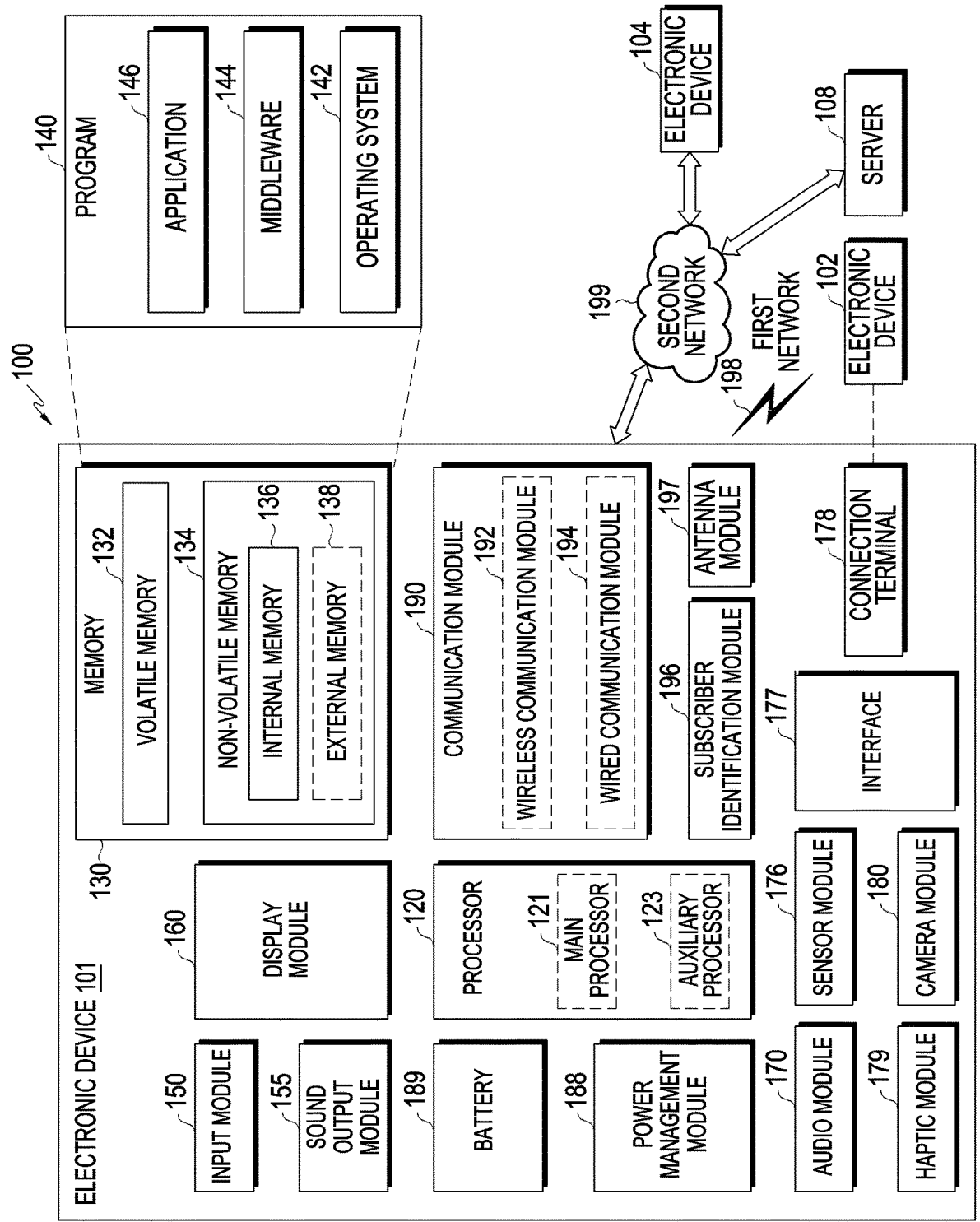
FIG. 1 is a block diagram of an electronic device in a network environment, according to an embodiment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence model is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
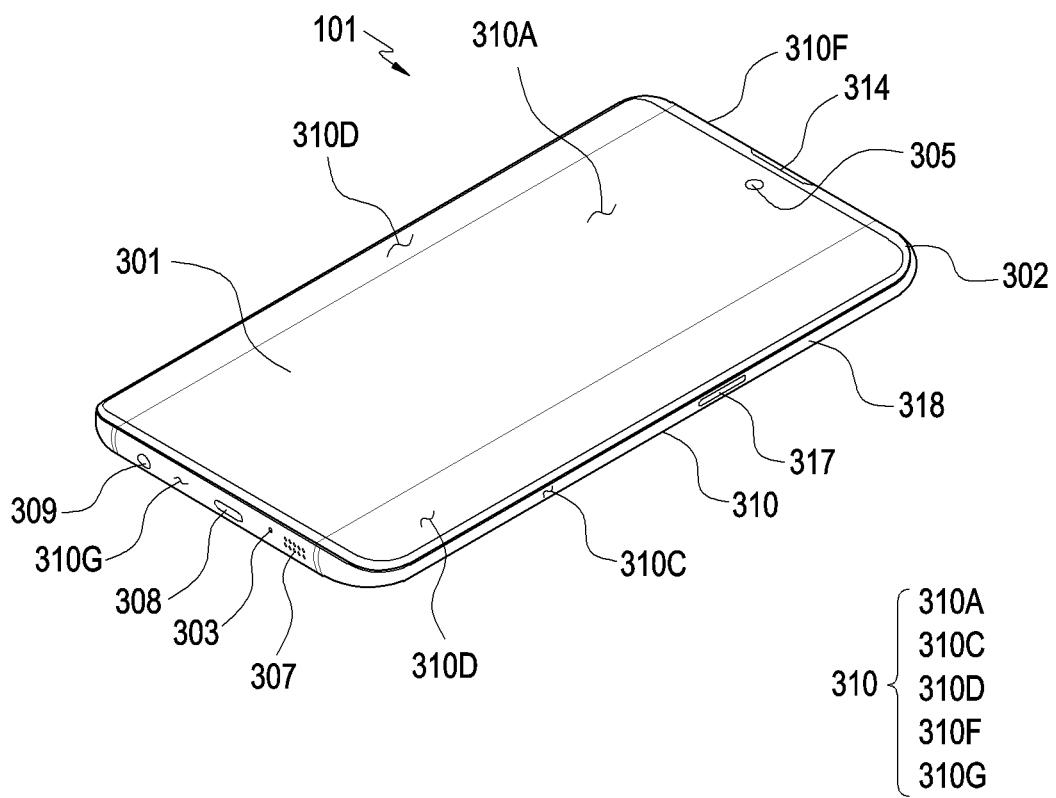
FIG. 2 is a front perspective view of an electronic device according to an embodiment.
Figure 3:
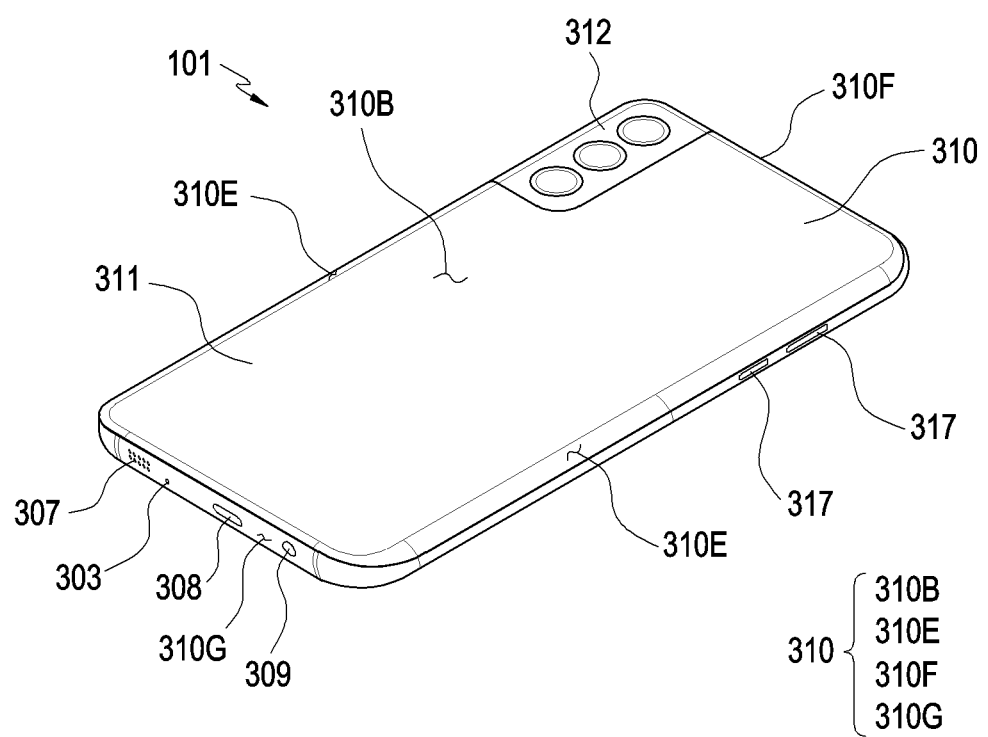
FIG. 3 is a rear perspective view of an electronic device according to an embodiment.

FIG. 2 is a front perspective view of an electronic device according to various embodiments of the disclosure. FIG. 3 is a rear perspective view of an electronic device according to various embodiments of the disclosure.

Referring to FIGS. 2 and 3, the electronic device 101 may include a housing 310 including a front surface 310A, a rear surface 310B, and a side surface 310C surrounding a space between the front surface 310A and the rear surface 310B. In another embodiment, a structure including a part of the front surface 310A and the side surface 310C of FIG. 2 and the rear surface 310B of FIG. 3 may be referred to as a housing 310. In embodiments, the front surface 310A may be formed by a front plate 302 (e.g., a glass plate including various coating layers, or a polymer plate) having at least a part which is substantially transparent. The rear surface 310B may be formed by a rear plate 311. The rear plate 311 may be formed by, for example, glass, ceramic, a polymer, a metal (e.g., aluminum, stainless steel (STS), or magnesium), or a combination of at least two thereof. The side surface 310C may be formed by a side bezel structure 318 (or a side member) that is coupled to the front plate 302 and the rear plate 311 and includes a metal and/or a polymer. In an embodiment, the rear plate 311 and side bezel structure 318 may be integrally formed and include the same material (e.g., glass, a metal material such as aluminum, or ceramic).

In the illustrated embodiment, the front plate 302 may include two first edge regions 310D, which are arranged at opposite ends of the longer edges of the front plate 302, respectively, and are curved and seamlessly extend from the front surface 310A toward the rear plate 311. As illustrated in FIG. 3, the rear plate 311 may include two second edge regions 310E formed at opposite ends of the longer edges thereof, respectively, and curved and seamlessly extending from the rear surface 310B toward the front plate 302. In an embodiment, the front plate 302 (or the rear plate 311) may include only one of the first edge regions 310D (or the second edge regions 310E). In another embodiment, a part of the first edge regions 310D or the second edge regions 310E may not be included. In embodiments, when viewed from the side of the electronic device 101, the side bezel structure 318 may have a first thickness (or width) on a side surface where the first edge regions 310D or the second edge regions 310E are not included and may have a second thickness thinner than the first thickness on a side surface where the first edge regions 310D or the second edge regions 310E are included.

In embodiments, the electronic device 101 may include at least one of a display 301, audio modules 303, 307, and 314 (e.g., the audio module 170 of FIG. 1), a sensor module (e.g., the sensor module 176 of FIG. 1), camera modules 305 and 312 (e.g., the camera module 180 of FIG. 1), a key input device 317 (e.g., the input module 150 of FIG. 1), and connector holes 308 and 309 (e.g., the connecting terminal 178 of FIG. 1). In an embodiment, the electronic device 101 may have at least one of the elements (e.g., the connector hole 309) omitted therefrom or may further include another element.

In embodiments, the display 301 may be visually exposed, for example, through a significant part of the front plate 302. In an embodiment, at least a part of the display 301 may be visually exposed through the front plate 302 forming the front surface 310A and the first edge regions 310D. In an embodiment, the edge of the display 301 may be configured to have substantially the same shape as the outer edge of the front plate 302 adjacent thereto. In another embodiment, in order to expand an area where the display 301 is visually exposed, the display may be configured such that the distance between the outer edge of the display 301 and the outer edge of the front plate 302 is maintained to be substantially the same.

In embodiments, the surface (or the front plate 302) of the housing 310 may include a screen display region formed when the display 301 is visually exposed. For example, the screen display region may include the front surface 310A and first edge regions 310D.

In embodiments, a first side surface 310F may be disposed in the +X direction (e.g., the +X direction of FIG. 4) of the housing 310, and a second side surfaces 310G may be disposed in the −X direction (e.g., the −X direction of FIG. 4) of the housing 310.

In another embodiment, a part of a screen display region (e.g., the front surface 310A and the first edge region 310D) of the display 301 may have a recess or opening formed therethrough and include at least one of the audio module 314, the sensor module, a light-emitting element, and the camera module 305, which are aligned with the recess or the opening. In another embodiment, the display 301 may include at least one of the audio module 314, the sensor module, and the camera module 305, a fingerprint sensor, and a light-emitting element, which are disposed on the rear surface of the screen display region thereof. In another embodiment, the display 301 may be coupled or adjacent to a touch sensing circuit, a pressure sensor capable of measuring the intensity (or pressure) of a touch, and/or a digitizer for detecting a magnetic field type stylus pen. In an embodiment, at least one of the key input devices 317 may be disposed on the first edge regions 310D and/or the second edge regions 310E.

According to various embodiments, a first camera module 305 among the camera modules 305 and 312 and/or the sensor module may be arranged in the inner space of the electronic device 101 to communicate with the external environment through a transmissive region of the display 301. In embodiments, a region facing the first camera module 305 of the display 301 may be formed as a transmissive region having a designated transmittance as a part of a region displaying content. In embodiments, the transmissive region may be formed to have a transmittance in the range of about 5% to about 20%. The transmissive region may include a region overlapping an effective region (e.g., an angle-of-view region) of the first camera module 305 through which light for generating an image formed by an image sensor passes. For example, the transmissive region of the display 301 may include a region having a pixel density and/or a wiring density lower than the periphery thereof. For example, the transmissive area may replace a recess or opening.

In embodiments, the audio module 303 may include a microphone hole, the audio module 307 may include a speaker hole, and the audio module 314 may include a speaker hole. A microphone for acquiring external sound may be disposed inside the microphone hole of audio module 303, and in an embodiment, a plurality of microphones may be arranged inside thereof so as to sense the direction of sound. The speaker holes of audio modules 307 and 314 may include an external speaker hole of audio module 307 and a call receiver hole of audio module 314. In an embodiment, the speaker holes of audio modules 307 and 314 and the microphone hole of audio module 303 may be implemented by one hole, or a speaker may be provided without the speaker holes of audio modules 307 and 314 (e.g., when of audio modules 307 and 314 are implemented using piezo speakers). The audio modules 303, 307, and 314 are not limited to the above structure, and may be variously designed and changed according to a structure of the electronic device 101 by mounting only one of the audio modules, adding a new audio module, or the like.

In embodiments, the sensor module may generate an electrical signal or a data value corresponding to, for example, an internal operating state or an external environmental state of the electronic device 101. The sensor module may include, for example, a first sensor module (e.g., a proximity sensor) and/or a second sensor module (e.g., a fingerprint sensor) disposed on the front surface 310A of the housing 310, and/or a third sensor module (e.g., a HRM sensor) and/or a fourth sensor module (e.g., a fingerprint sensor) disposed on the rear surface 310B of the housing 310. In an embodiment, the fingerprint sensor may be disposed not only on the front surface 310A (e.g., the display 301) of the housing 310 but also on the rear surface 310B thereof. The electronic device 101 may further include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor. The sensor module is not limited to the above structures, and may be variously designed and changed according to a structure of the electronic device 101 by mounting only one of the sensor modules, adding a new sensor module, or the like.

In embodiments, the camera modules 305 and 312 may include, for example, a first camera module 305 disposed on the front surface 310A of the electronic device 101, and a second camera module 312 and/or a flash disposed on the rear surface 310B thereof. The camera modules 305 and 312 may include one or more lenses, an image sensor, and/or an image signal processor. The flash may include, for example, a light-emitting diode or a xenon lamp. In an embodiment, two or more lenses (an infrared camera, wide-angle and telephoto lenses) and image sensors may be disposed on first surface of the electronic device 101. The camera modules 305 and 312 are not limited to the above structure, and may be variously designed and changed according to a structure of the electronic device 101 by mounting only one of the camera modules, adding a new camera module, or the like.

In embodiments, the electronic device 101 may include a plurality of camera modules (e.g., a dual camera or a triple camera) each having a different property (e.g., angle of view) or a function. For example, the plurality of camera modules 305 and 312 including lenses having different angles of view may be provided, and the electronic device 101 may perform control such that the angle of view of the camera modules 305 and 312 performed by the electronic device 101 are changed based on a user's selection. For example, among the camera modules 305 and 312, at least one may be a wide-angle camera and the other one may be a telephoto camera. Similarly, among the camera modules 305 and 312, at least one may be a front camera and the other one may be a rear camera. In addition, the camera modules 305 and 312 may include at least one of a wide-angle camera, a telephoto camera, or an infrared (IR) camera (e.g., a time of flight (TOF) camera, a structured light camera). In embodiments, the IR camera may be operated as at least a part of the sensor module. For example, the TOF camera may be operated as at least a part of a sensor module for detecting the distance to the subject.

In embodiments, the key input devices 317 may be disposed on the side surface 310C of the housing 310. In another embodiment, the electronic device 101 may not include one or all of the key input devices 317 mentioned above, and the key input device 317 that is not included in the electronic device 101 may be implemented on the display 301 in a different form such as a soft key or the like. In an embodiment, the key input devices may include the sensor module 316 disposed on the rear surface 310B of the housing 310.

In embodiments, the light-emitting element may be disposed, for example, on the front surface 310A of the housing 310. The light-emitting element may provide, for example, state information of the electronic device 101 in the form of light. In another embodiment, the light-emitting element may provide, for example, a light source interworking with the operation of the front camera module 305. The light-emitting element may include, for example, an LED, an IR LED, and a xenon lamp.

In embodiments, the connector holes 308 and 309 may include, for example, a first connector hole 308 capable of receiving a connector (e.g., a USB connector) for transmitting and receiving power and/or data to and from an external electronic device, and/or a second connector hole 309 (e.g., an earphone jack) capable of receiving a connector for transmitting and receiving an audio signal to and from an external electronic device.

In embodiments, the first camera module 305 of the camera modules 305 and 312, and/or some sensor modules of the sensor modules may be displayed to be visually exposed to the outside through at least a part of the display 301. For example, the camera module 305 may include a punch hole camera disposed inside a hole or recess formed in the rear surface of the display 301. In embodiments, the second camera module 312 may be disposed inside the housing 310 such that the lens is visually exposed to the rear surface 310B of the electronic device 101. For example, the second camera module 312 may be disposed on a printed circuit board (e.g., the printed circuit board 340 of FIG. 4).

In embodiments, the first camera module 305 and/or the sensor module may be arranged in the inner space of the electronic device 101 to the front plate 302 of the display 301 so as to communicate with the external environment through a transparent region. In addition, some sensor modules 304 may be arranged to perform functions thereof without being visually exposed through the front plate 302 in the inner space of the electronic device.

Figure 4:
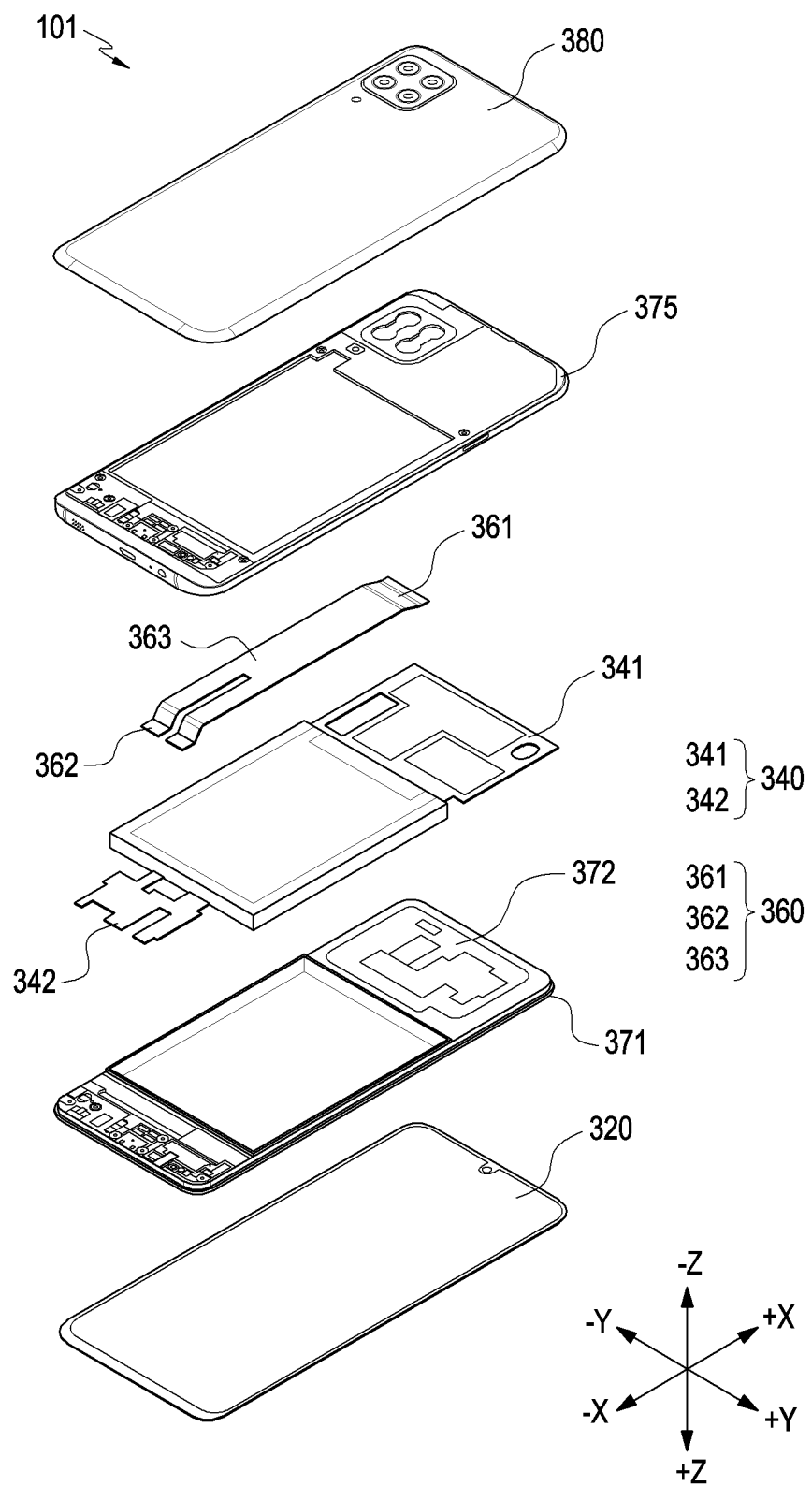
FIG. 4 is an exploded rear view of an electronic device according to an embodiment.
Figure 5:
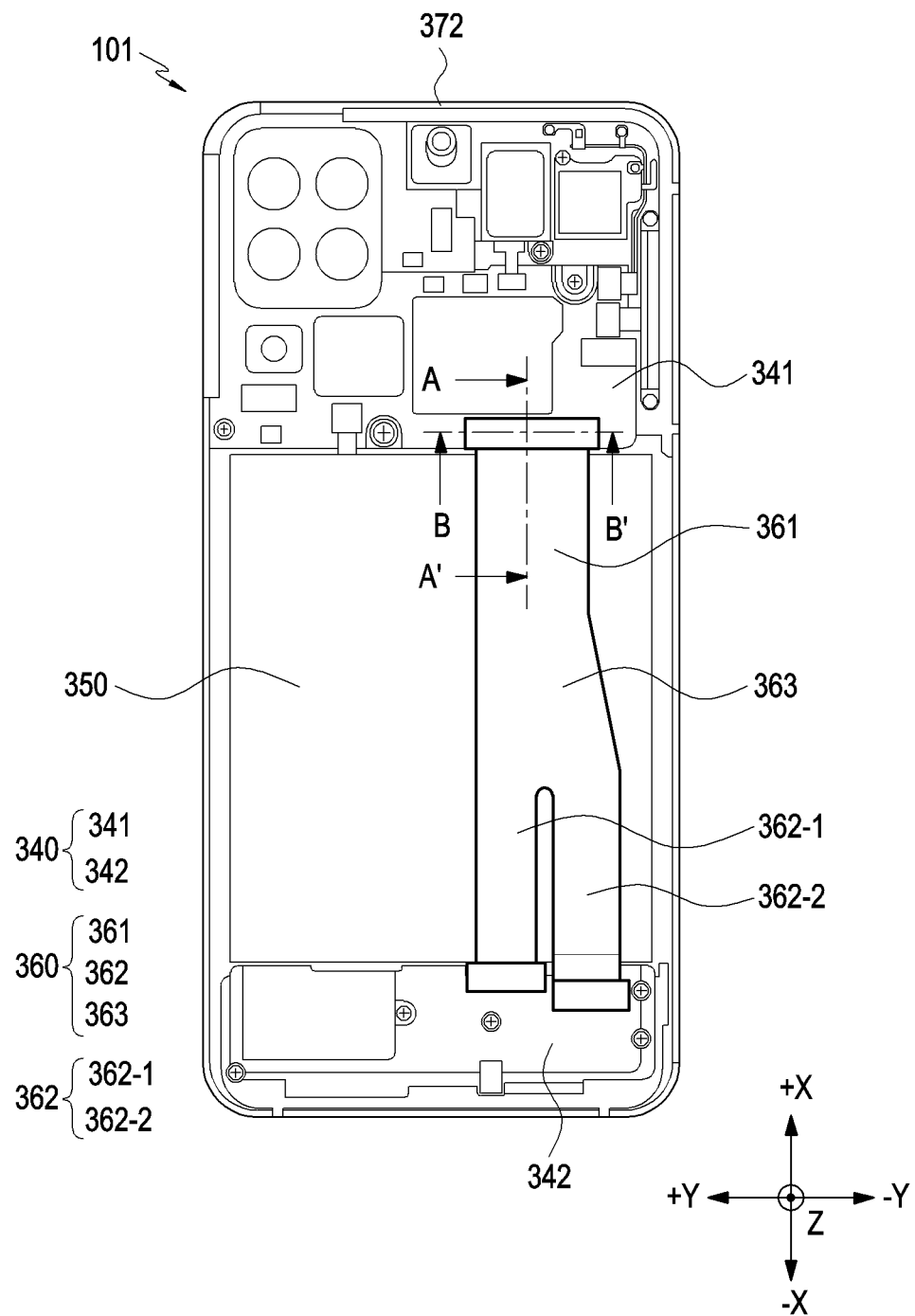
FIG. 5 is a rear view illustrating an arrangement relationship of a printed circuit board, a flexible printed circuit board, and an electrical component of an electronic device according to an embodiment.

FIG. 4 is an exploded rear view of an electronic device according to various embodiments of the disclosure. FIG. 5 is a rear view illustrating an arrangement relationship of a printed circuit board, a flexible printed circuit board, and an electrical component of an electronic device according to various embodiments of the disclosure.

Hereinafter, for convenience of description, in FIGS. 4 to 7, a direction from the rear plate 380 toward the front plate 320 may be defined and understood as the +Z direction, a direction from the front plate 320 toward the rear plate 380 may be defined and understood as the −Z direction, the direction from the second printed circuit board 342 toward the first printed circuit board 341 may be defined and understood as the +X direction, the direction from the first printed circuit board 341 toward the second printed circuit board 342 may be defined and understood as the −X direction, one direction perpendicular to a plane formed by the X and Z axes with respect to the battery 350 may be defined and understood as the +Y direction, and a direction which is perpendicular to a plane formed by the X and Z axes with respect to the battery 350 and is different from the +Y direction may be defined and understood as the −Y direction. For example, the X-axis direction may be understood as the longitudinal direction of the electronic device 101 and components of the electronic device 101, the Y-axis direction may be understood as the width direction of the electronic device 101 and components of the electronic device 101, and the Z-axis direction may be understood as the height and/or thickness direction of the electronic device 101 and components of the electronic device 101.

Referring to FIGS. 4 to 5, the electronic device 101 (e.g., the electronic device 101 of FIGS. 1 to 3) according to various embodiments may include a first support member 372, a front plate 320 (e.g., the front plate 302 of FIG. 2), a printed circuit board 340 (e.g., a printed circuit board (PCB), a flexible PCB (FPCB), or a rigid flexible PCB (RFPCB)), a battery 350 (e.g., the battery 189 of FIG. 1), a flexible printed circuit board 360, a second support member 375 (e.g., a rear case), and/or a rear plate 380 (e.g., the rear plate 311 of FIG. 2). In embodiments, a first support member 372 of the electronic device 101 may include a side bezel structure 371 (e.g., the side bezel structure 318 of FIG. 2).

According to an embodiment, the electronic device 101 may have at least one (e.g., the first support member 372 or the second support member 375) of the above-mentioned components omitted therefrom or may further include another component. At least one of the components of the electronic device 101 may be identical or similar to at least one of the components of the electronic device 101 of FIG. 2 or 3, and an overlapping description thereof will be omitted.

According to various embodiments, the first support member 372 may be disposed inside the electronic device 101 and connected to a side bezel structure (e.g., the side bezel structure 318 of FIG. 2) or may be integrally formed with the side bezel structure. For example, the first support member 372 may be formed of a metal material and/or a non-metal (e.g., polymer) material. In embodiments, the first support member 372 may have first surface coupled to a display (e.g., the display of FIG. 2) and the second surface coupled to the printed circuit board 340.

According to various embodiments, the printed circuit board 340 may include a processor (e.g., the processor 120 of FIG. 1), a memory (e.g., the memory 130 of FIG. 1), and/or an interface (e.g., the interface 177 of FIG. 1) which are mounted thereon. For example, the processor may include one or more of a central processing unit, an application processor, a graphics processing unit, an image signal processor, a sensor hub processor, or a communication processor. According to various embodiments, the printed circuit board 340 may include a flexible printed circuit board-type radio frequency cable (FRC). For example, the printed circuit board 340 may be disposed on at least a part of the first support member 372 and may be electrically connected to an antenna module (e.g., the antenna module 390 and/or a communication module of FIG. 1 (e.g., the communication module 190 of FIG. 1). In embodiments, the printed circuit board 340 may include a first printed circuit board 341 and/or a second printed circuit board 342. The first printed circuit board 341 and/or the second printed circuit board 342 may include one or all of the elements included in the printed circuit board 340.

In embodiments, the first printed circuit board 341 may be disposed in the +X direction with respect to the battery 350, and the second printed circuit board 342 may be disposed in the −X direction. According to another embodiment, the first printed circuit board 341 may be disposed in the +Z direction with respect to the battery 350, and the second printed circuit board 342 may be disposed in the −Z direction with respect to the battery 350. According to still another embodiment, the first printed circuit board 341 may be disposed in the +Y direction with respect to the battery 350, and the second printed circuit board 342 may be disposed in the −Y direction with respect to the battery 350. According to still another embodiment, the first printed circuit board 341 may be disposed in one direction with respect to the battery 350, and the second printed circuit board 342 may be disposed in a direction different from the one direction with respect to the battery 350. According to still another embodiment, the first printed circuit board 341 and the second printed circuit board 342 may be disposed to be spaced apart from each other in the same direction with respect to the battery 350.

In embodiments, the memory may include a volatile memory or a non-volatile memory.

In embodiments, the interface may include a high-definition multimedia interface (HDMI), a universal serial bus (USB) interface, an SD card interface, and/or an audio interface. For example, the interface may electrically and/or physically connect the electronic device 101 and an external electronic device (e.g., the electronic device 102 or the electronic device 104 of FIG. 1), and may include a USB connector, an SD card/MMC connector, and/or an audio connector.

According to various embodiments, the battery 350 is a device for supplying power to at least one element or electrical component of the electronic device 101 and may include a non-rechargeable primary cell, a rechargeable secondary cell, or a fuel cell. In embodiments, the battery 350 may be integrally disposed inside the electronic device 101. According to another embodiment, the battery 350 may be detachably disposed on the electronic device 101.

According to various embodiments, the second support member 375 (e.g., a rear case) may be disposed between the printed circuit board 340 and an antenna (e.g., the antenna module 197 of FIG. 1). In embodiments, the second support member 375 may include first surface coupled to at least one of the printed circuit board 340 or the battery 350, and the second surface coupled to the antenna.

According to various embodiments, the antenna (e.g., the antenna module 197 of FIG. 1) may be disposed between the rear plate 380 and the battery 350. For example, the antenna may include a near field communication (NFC) antenna, a wireless charging antenna, and/or a magnetic secure transmission (MST) antenna. For example, the antenna may perform short-range communication with an external device or wirelessly transmit/receive power required for charging. In another embodiment, an antenna structure may be formed by a part of the side bezel structure and/or the first support member 372 or a combination thereof.

According to various embodiments, the rear plate 380 may form at least a part of the rear surface (e.g., the rear surface 310B of FIG. 3) of the electronic device 101.

According to various embodiments, the electronic device 101 may include a flexible printed circuit board (FPCB) 360. In embodiments, the flexible printed circuit board 360 may electrically connect the first printed circuit board 341 and the second printed circuit board 342 to each other.

In embodiments, the first printed circuit board 341 may include a first surface (e.g., a surface facing in the −Z direction) facing the rear plate 380 and a second surface (e.g., a surface facing in the +Z direction) facing the front plate 320. In embodiments, the flexible printed circuit board 360 may be electrically and/or physically connected to the first surface of the first printed circuit board 341. According to another embodiment, the flexible printed circuit board 360 may be electrically and/or physically connected to the second surface of the first printed circuit board 341. According to still another embodiment, the flexible printed circuit board 360 may include a structure electrically and/or physically connected to both the first and second surfaces of the first printed circuit board 341.

In embodiments, the second printed circuit board 342 may include a first surface (e.g., a surface facing in the −Z direction) facing the rear plate 380 and a second surface (e.g., a surface facing in the +Z direction) facing the front plate 320. In embodiments, the flexible printed circuit board 360 may be electrically and/or physically connected to the first surface of the second printed circuit board 342. According to another embodiment, the flexible printed circuit board 360 may be electrically and/or physically connected to the second surface of the second printed circuit board 342. According to still another embodiment, the flexible printed circuit board 360 may include a structure electrically and/or physically connected to both first and second surfaces of the second printed circuit board 342.

In embodiments, at least one part of the electrical component (e.g., the battery 350) may face the flexible printed circuit board 360.

In embodiments, the battery 350 may include a first surface (e.g., a surface facing in the −Z direction) facing the rear plate 380 and a second surface (e.g., a surface facing in the +Z direction) facing the front plate 320. In embodiments, the flexible printed circuit board 360 may face the first surface of the battery 350. For example, the flexible printed circuit board 360 may be spaced apart from the first surface of the battery 350 by a predetermined distance.

According to various embodiments, the flexible printed circuit board 360 may include a first region 361 connected to the first printed circuit board 341, a second region 362 connected to the second printed circuit board 342, and a connection region 363 connecting the first region 361 and the second region 362. In embodiments, the connection region 363 may extend in one direction (e.g., the X direction) to cross the battery 350 inside the electronic device 101. In embodiments, the connection region 363 may be disposed between the battery 350 and the rear plate 380. For example, the connection region 363 may be spaced apart from the battery 350 by a predetermined distance and may be spaced apart from the rear plate 380 by a predetermined distance. According to another embodiment, the connection region 363 may be disposed between the battery 350 and the front plate 320. For example, the connection region 363 may be spaced apart from the battery 350 by a predetermined distance and may be spaced apart from the front plate 320 by a predetermined distance. According to another embodiment, the connection region 363 may be disposed so as not to interfere with and/or overlap a display (e.g., the display 301 of FIG. 2) inside the electronic device 101.

In embodiments, the second region 362 may include a region 362-1 connected to one part of the second printed circuit board 342, and a region 362-2 connected to the other part of the second printed circuit board 342. According to another embodiment, one of the region 362-1 and the region 362-2 may be connected to the second printed circuit board 342, and the other one may be electrically connected to an electrical component (e.g., the audio module 307 or the connector holes 308 and 309 of FIG. 3).

Figure 6A:
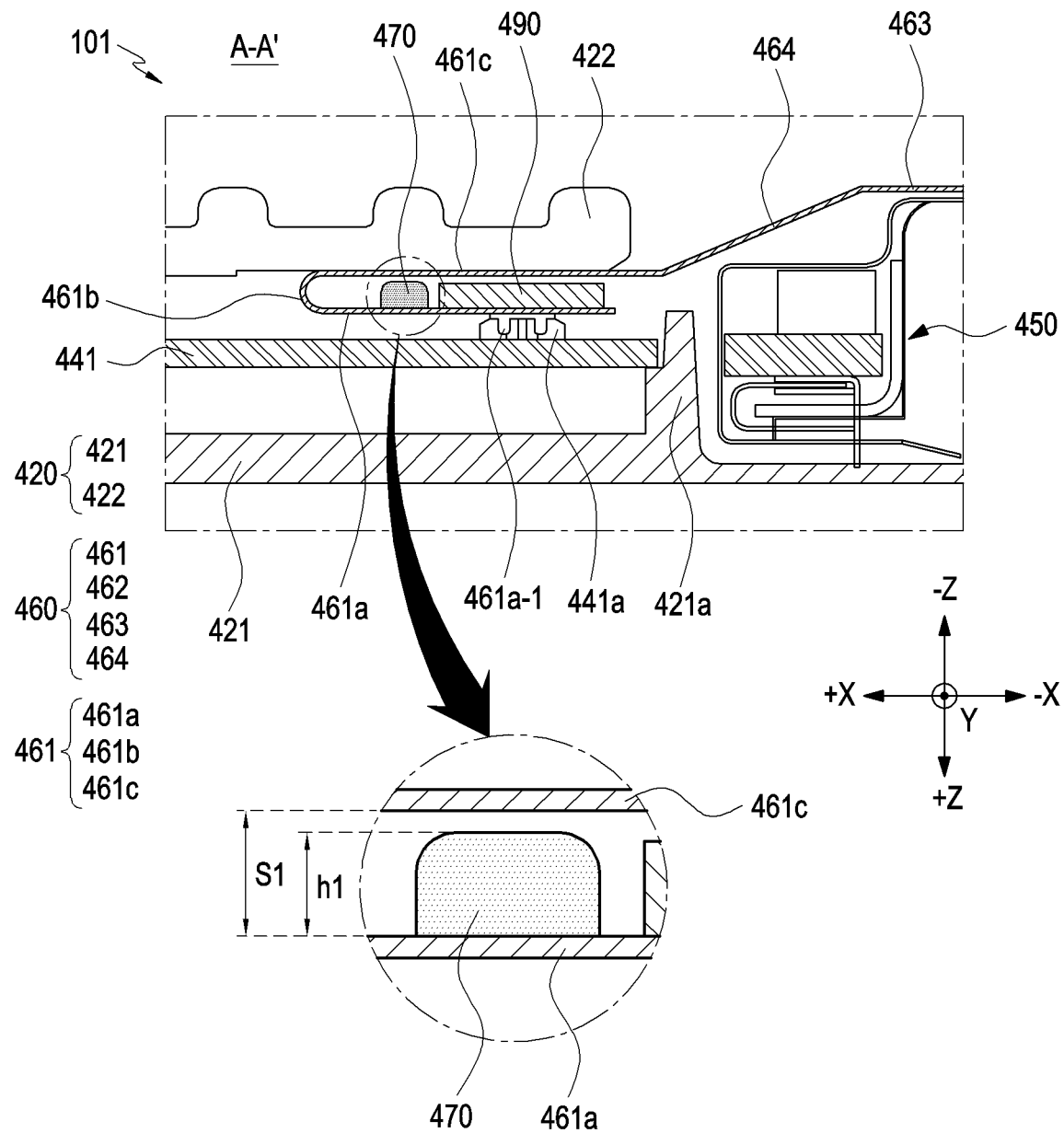
FIG. 6A is a cross-sectional view taken along line A-A' of FIG. 5, showing a state before a bending part of a flexible printed circuit board is deformed, according to an embodiment.
Figure 6B:
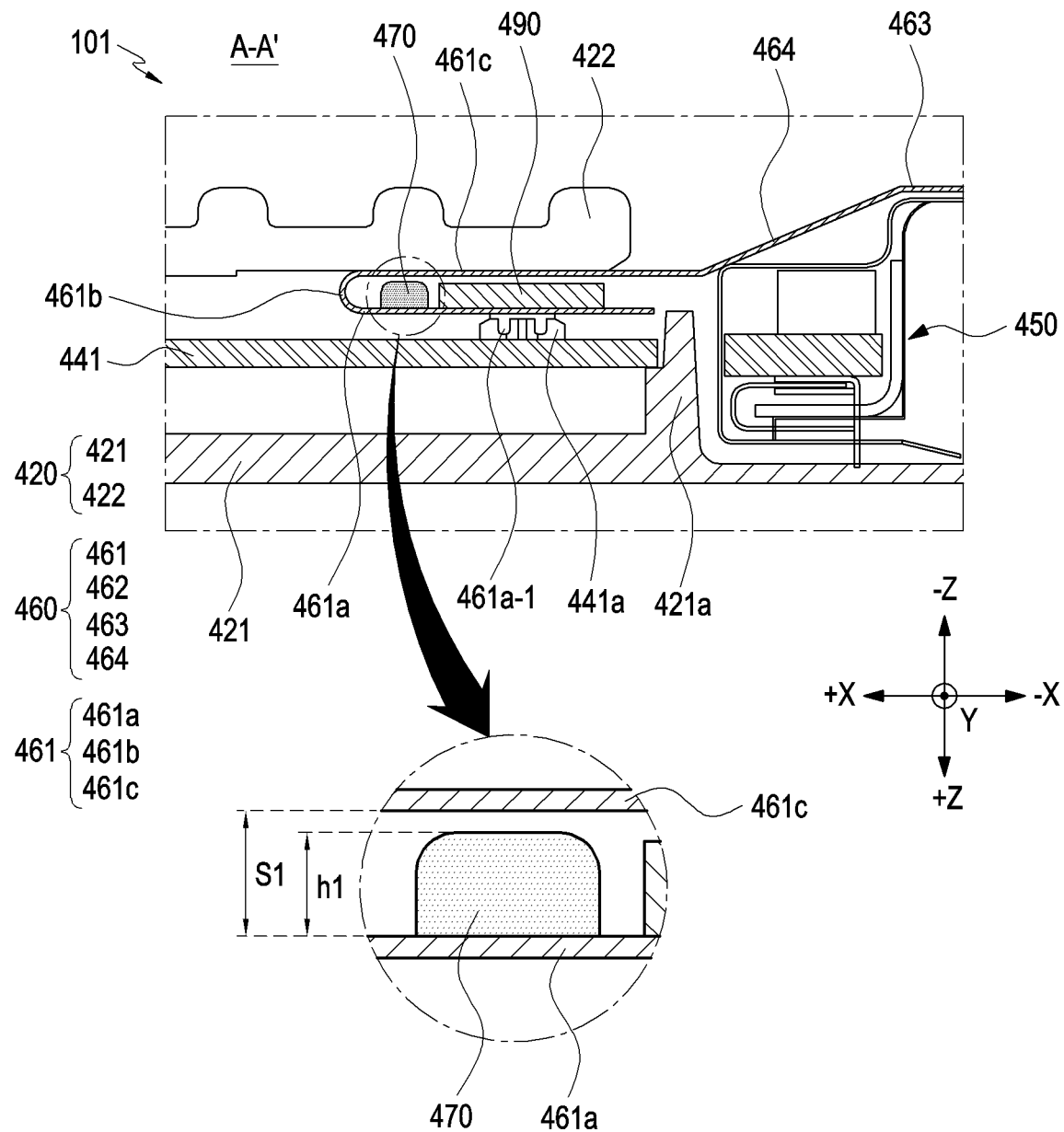
FIG. 6B is a cross-sectional view taken along line A-A' of FIG. 5, showing a state after the bending part of the flexible printed circuit board is deformed, according to an embodiment.

FIG. 6A is a cross-sectional view taken along line A-A' of FIG. 5, showing a state before a bending part of a flexible printed circuit board is deformed, according to various embodiments of the disclosure. FIG. 6B is a cross-sectional view taken along line A-A' of FIG. 5, showing a state after the bending part of the flexible printed circuit board is deformed, according to various embodiments of the disclosure.

Referring to FIGS. 6A to 6B, the electronic device 101 according to various embodiments may include a housing 420, a flexible printed circuit board 460, a buffer member 470, a reinforcing member 490, and a first printed circuit board 441, a battery module 450, and/or a second support member. The configuration of the electronic device 101, the flexible printed circuit board 460, the first printed circuit board 441, and/or the battery module 450 of FIGS. 6A to 6B may be partially or entirely the same as that of the electronic device 101, the flexible printed circuit board 360, the first printed circuit board 341, and/or the battery 350 of FIGS. 4 to 5.

According to various embodiments, the housing 420 may include a first housing 421 and a second housing 422. In embodiments, the first housing 421 and the second housing 422 may be formed separately. According to another embodiment, the first housing 421 and the second housing 422 may be integrally formed with each other.

In embodiments, at least one part of the first housing 421 may include a support member 421a configured to support the first printed circuit board 441. The support member 421a may be disposed between the first printed circuit board 441 (e.g., the first printed circuit board 341 of FIG. 4) and the battery module 450 (e.g., the battery 350 of FIG. 4). For example, the support member 421a may limit the collision between the first printed circuit board 441 and the battery module 450. In one embodiment, the first housing 421 may be understood as at least a part of a first support member (e.g., the first support member 372 of FIG. 4). In another embodiment, the first housing 421 may be understood as at least a part of a housing (e.g., the housing 310 of FIGS. 2 to 3).

In embodiments, at least one part of the second housing 422 may be spaced apart from the first housing 421 in a thickness direction (the Z-axis direction) of the electronic device 101. At least one part of the second housing 422 may face the flexible printed circuit board 460 (e.g., the flexible printed circuit board 360 of FIGS. 4 to 5). For example, the second housing 422 may limit exposure of at least one part of the flexible printed circuit board 460 to the outside of the electronic device 101. In one embodiment, the second housing 422 may be understood as at least a part of the second support member (e.g., the second support member 375 of FIG. 4). In another embodiment, the second housing 422 may be understood as at least a part of a housing (e.g., the housing 310 of FIGS. 2 to 3).

In embodiments, the first printed circuit board 441 may be disposed between the first housing 421 and the second housing 422. In embodiments, the first printed circuit board 441 may have at least one part supported by the first housing 421 and include a third connector 441a disposed on one surface (e.g., a surface facing in the −Z direction) thereof facing the second housing 422. For example, the third connector 441a may be electrically and/or physically connected to the first connector 461a-1 of the flexible printed circuit board 460.

According to various embodiments, the flexible printed circuit board 460 may include a bending part 461, a first inclined part 464, and a third flat part 463. For example, at least one part of the flexible printed circuit board 460 may be disposed in the housing 420, and may electrically connect a second printed circuit board (e.g., the second printed circuit board 342 of FIG. 4) to a first printed circuit board 441.

According to various embodiments, the bending part 461 may extend in a direction away from the second printed circuit board (e.g., the second printed circuit board 342 of FIGS. 4 to 5) and then be bent so as to extend toward the second printed circuit board.

According to various embodiments, the bending part 461 may include a first flat part 461a, a bent part 461b, and/or a second flat part 461c. In one embodiment, the bending part 461 may be understood as at least a part of a first region (e.g., the first region 361 of FIGS. 4 to 5) of the flexible printed circuit board 460 connected to the first printed circuit board 441.

In embodiments, the first flat part 461a may be disposed substantially parallel to the first printed circuit board 441. For example, the first flat part 461a may extend from a part (e.g., a part where the first connector 461a-1 is disposed) connected to the first printed circuit board 441 in a direction (e.g., the +X direction) away from the second printed circuit board (e.g., the second printed circuit board 342 of FIGS. 4 to 5). According to another embodiment, the first flat part 461a may be disposed to be inclined to form a predetermined angle (e.g., a predetermined angle with respect to the X-axis of FIGS. 6A to 6B) with respect to the first printed circuit board 441, and may extend in a direction away from the second printed circuit board.

In embodiments, the first connector 461a-1 may be electrically and/or physically connected to the third connector 441a of the first printed circuit board 441. In embodiments, the first printed circuit board 441 may be electrically connected to the second printed circuit board through a third connector 441a, a first connector 461a-1, a flexible printed circuit board 460, and a second connector of the flexible printed circuit board 460, and/or a fourth connector of the second printed circuit board.

In embodiments, a first end of the bent part 461b may be connected to a first end of the first flat part 461a (e.g., a part furthest from the second printed circuit board). In embodiments, a second end of the bent part 461b may be connected to a first end (e.g., a part furthest from the second printed circuit board) of the second flat part 461c. In embodiments, the bent part 461b may have a shape curved toward the second printed circuit board. For example, at least one part of the bent part 461b may convexly protrude in a direction opposite to the second printed circuit board (e.g., the +X direction).

In embodiments, the second flat part 461c may be disposed substantially parallel to the first flat part 461a. For example, the second flat part 461c may extend from the bent part 461b in a direction (e.g., the −X-axis direction of FIGS. 6A to 6B) in which the same becomes closer to the second printed circuit board. At least one part of the second flat part 461c may be disposed adjacent to the second housing 422. According to another embodiment, the second flat part 461c may be inclined to form a predetermined angle with respect to the first flat part 461a, and may extend in a direction in which the same becomes closer to the second printed circuit board.

In embodiments, a first end of the first inclined part 464 may be connected to the second end (e.g., a part closest to the second printed circuit board) of the second flat part 461c. In embodiments, the first inclined part 464 may inclinedly extend to form a predetermined angle with respect to the longitudinal direction (e.g., the X-axis direction of FIGS. 6A to 6B) of the first housing 421. For example, the first inclined part 464 may be disposed to be inclined toward a direction (e.g., the −X direction of FIGS. 6A to 6B) away from the first printed circuit board 441 and toward a direction (e.g., the −Z direction of FIGS. 6A to 6B) gradually away from the first housing 421.

In embodiments, a first end of the third flat part 463 may be connected to the second end (e.g., a part furthest from the first printed circuit board 441) of the first inclined part 464. In embodiments, the third flat part 463 may be disposed substantially parallel to the first housing 421. In embodiments, the third flat part 463 may extend from the first inclined part 464 in a direction (e.g., the −X direction of FIGS. 6A to 6B) in which the same becomes closer to the second printed circuit board. In embodiments, at least one part of the third flat part 463 may be understood as a second region (e.g., the second region 362 of FIGS. 4 to 5) of the flexible printed circuit board 460 connected to the second printed circuit board.

According to various embodiments, at least one part of the first inclined part 464 and/or the third flat part 463 of the flexible printed circuit board 460 may face an electrical component (e.g., the battery module 450). For example, the first inclined part 464 and/or the third flat part 463 of the flexible printed circuit board 460 may be disposed to be spaced apart from the electrical component (e.g., the battery module 450) by a predetermined distance.

In embodiments, at least one part of the electrical component (e.g., the battery module 450) of the electronic device 101 may be fixed and/or supported by the first housing 421.

According to various embodiments, the buffer member 470 may be disposed inside the bent part 461. In embodiments, the buffer member 470 may be disposed between the first flat part 461*a* and the second flat part 461*c*. For example, the height (h1) (e.g., the length in the Z-axis direction) of the buffer member 470 may be smaller than the spacing distance (s1) between the first flat part 461*a* and the second flat part 461*c*. For example, the buffer member 470 may be formed of an elastic member, such as rubber or synthetic resin, and may limit a direct collision between the first flat part 461*a* and the second flat part 461*c*. For another example, the buffer member 470 may be formed of various members limiting a direct collision between the first flat part 461*a* and the second flat part 461*c*. In embodiments, the buffer member 470 may be disposed on one surface (e.g., a surface facing in the –Z direction of FIGS. 6A to 6B) of the first flat part 461*a*. According to another embodiment, the buffer member 470 may be disposed on one surface (e.g., a surface facing in the +Z direction) of the second flat part 461*c*. According to still another embodiment, the buffer member 470 may be disposed on one surface (e.g., a surface facing in the +X direction) of the reinforcing member 490. According to various embodiments, the buffer member 470 may be disposed between one part (e.g., the first flat part 461*a*) of the bending part 461 and the other part (e.g., the second flat part 461*c*) of the bending part facing the one part of the bending part. In embodiments, the buffer member 470 may be disposed between the first flat part 461*a* and the second flat part 461*c* facing the first flat part 461*a*.

According to various embodiments, at least one part of the reinforcing member 490 may be coupled to the flexible printed circuit board 460. In embodiments, the reinforcing member 490 may be coupled to a surface of the flexible printed circuit board 460 opposite to the surface to which the first connector 441*a* is coupled. For example, the first connector 441*a* may be coupled to the first surface (e.g., a surface facing in the +Z direction) of the first flat part 461*a*, and the reinforcing member 490 may be coupled to the second surface (e.g., a surface facing in the –Z direction) of the first flat part 461*a*. In embodiments, at least one part of the reinforcing member 490 may include a protrusion (e.g., the protrusion 492 of FIG. 7) configured to support the housing (e.g., the second housing 422).

Hereinafter, a state before and after deformation of the bending part 461 will be described with reference to FIGS. 6A and 6B.

Referring to FIG. 6A, the bending part 461 may be disposed at a first position before being deformed. In embodiments, in a state in which the bending part 461 is disposed at the first position, the first inclined part 464 and/or the third flat part 463 of the flexible printed circuit board 460 may be maintained to be spaced apart from the battery module 450. The electronic device 101 may be pressed in an unspecified direction during the use thereof. In this case, the electrical component (e.g., the battery module 450) of the electronic device 101 may move inside the electronic device 101, relative to the electronic device 101. For example, the battery module 450 may move inside the electronic device 101 in one direction (e.g., the –Z direction). The movement of the battery module 450 may be restricted in the longitudinal direction (e.g., the X-axis direction) of the battery module 450 by the support member 421*a* and/or the second printed circuit board. The movement of the battery module 450 may be restricted in one direction (e.g., the +Z direction) among the thickness directions (e.g., the Z-axis directions) of the battery module 450 by the first housing 421. The battery module 450 may move inside the electronic device 101 in one direction (e.g., the –Z direction) by an impact or force applied to the electronic device 101. When the battery module 450 moves in one direction (e.g., the –Z direction), the battery module 450 may collide with at least one part of the first inclined part 464 and/or at least one part of the third flat part 463. The first inclined part 464 and/or the third flat part 463 may move in one direction (e.g., –Z direction) by the battery module 450, and accordingly, a force (e.g., a force pulling in the –X direction) may be applied to the bending part 461 such that the bending part 461 connected to the first inclined part 464 is pulled toward the second printed circuit board.

Referring to FIG. 6B, the bending part 461 may be disposed at the second position after being deformed. The second flat part 461*c* may move a predetermined distance from the first position (e.g., the position of the second flat part 461*c* of FIG. 6A) toward the second printed circuit board to be disposed at the second position. The bent part 461*b* may be bent at the first position (e.g., the position of the bent part 461*b* of FIG. 6A) toward the second printed circuit board and thus be disposed at the second position. At least one part (e.g., a part connected to the bent part 461*b* and a part adjacent thereto) of the first flat part 461*a* may be bent toward the second printed circuit board. The position of the other part (e.g., a part to which the first connector 461*a*-1 is coupled and a part adjacent thereto) of the first flat part 461*a* may be fixed despite a force applied to the bending part 461. When the second flat part 461*c* moves a predetermined distance, a part of the bent part 461*b* and/or a part of the first flat part 461*a* may be bent and deformed to accommodate the amount of movement, so that a part of the first flat part 461*a* to which the first connector 461*a*-1 is coupled may not move. Accordingly, in the electronic device 101 of the disclosure, even when a force by an electrical component (e.g., the battery module 450) acts on the flexible printed circuit board 460, the escape of the first connector 461*a*-1 from the third connector 441*a* of the first printed circuit board 441 may be restricted.

According to another embodiment, the structure and/or arrangement relationship of the bending part 461, the buffer member 470, and/or the reinforcing member 490 may be formed on a region (e.g., the second region 362 of FIG. 5) connected to the second printed circuit board (e.g., the second printed circuit board 342 of FIGS. 4 to 5) of the flexible printed circuit boards 460 (e.g., the flexible printed circuit board 360 of FIGS. 4 to 5).

Figure 7:
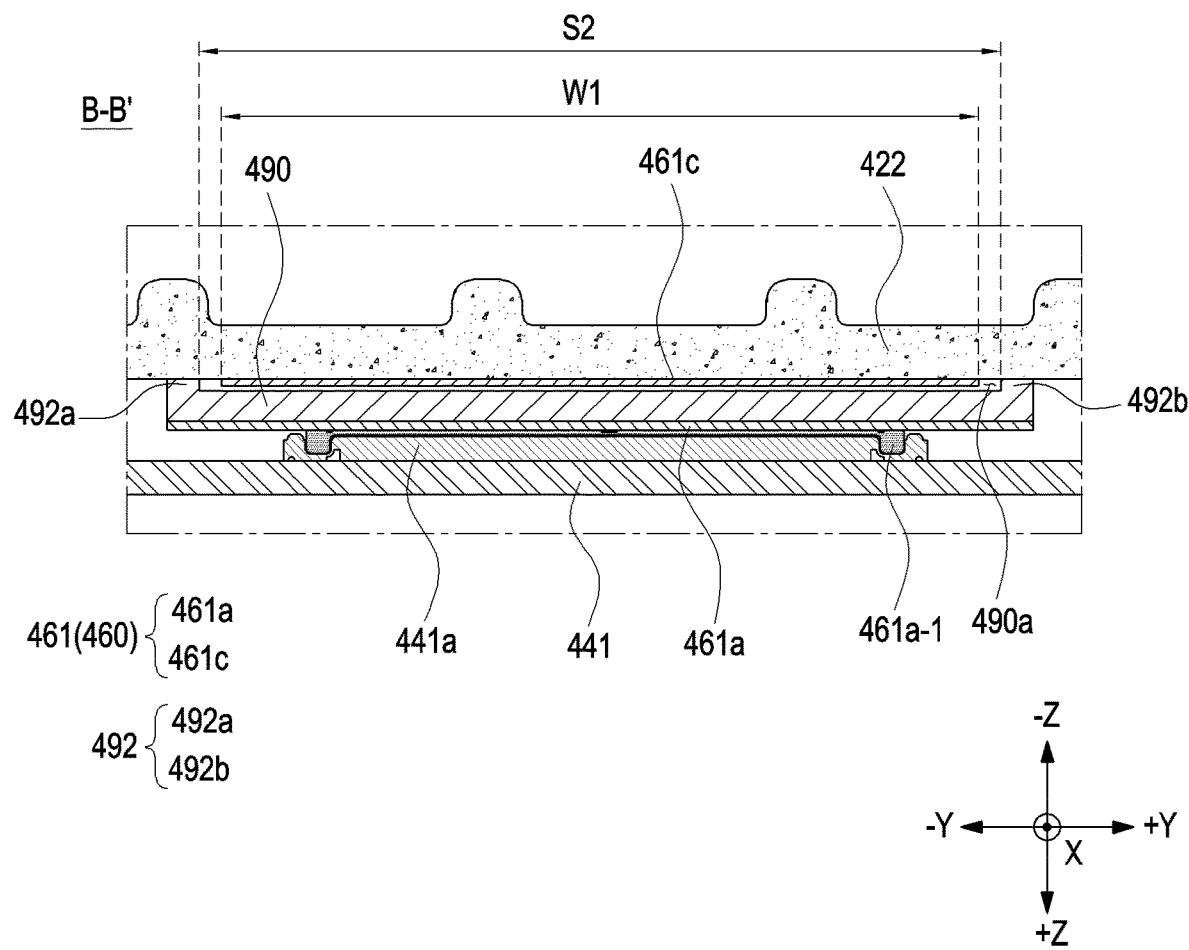
FIG. 7 is a cross-sectional view taken along line B-B' of FIG. 5 according to an embodiment.

FIG. 7 is a cross-sectional view taken along line B-B' of FIG. 5 according to various embodiments of the disclosure.

Referring to FIG. 7, the electronic device 101 according to various embodiments may include a second housing 422, a flexible printed circuit board 460, a reinforcing member 490, and/or a first printed circuit board 441. The configuration of the second housing 422, the flexible printed circuit board 460, the reinforcing member 490, and/or the first printed circuit board 441 of FIG. 7 may be partially or entirely the same as that of the second housing 422, the flexible printed circuit board 460, the reinforcing member 490, and/or the first printed circuit board 441 of FIGS. 6A to 6B.

According to various embodiments, one surface (e.g., a surface facing in the +Z direction) of the reinforcing member 490 may be coupled to at least a part (e.g., the first flat part 461*a*) of the flexible printed circuit board 460. In embodiments, the width of the reinforcing member 490 may be substantially the same as the width of the first flat part 461*a*. According to another embodiment, the width of the reinforcing member 490 may be smaller or greater than the width of the first flat part 461*a*.

According to various embodiments, at least one part of the reinforcing member 490 may include a protrusion 492 configured to support the housing (e.g., the second housing 422). For example, the protrusion 492 may have one surface (e.g., a surface facing in the −Z direction) directly or indirectly supporting the second housing 422, so that the spacing distance between the second housing 422 and the first printed circuit board 441 can be maintained. In one embodiment, it may be understood that at least one part (e.g., the protrusion 492) of the reinforcing member 490 is coupled to the housing (e.g., the second housing 422).

In embodiments, the protrusion 492 may include a first protrusion 492a, and a second protrusion 492b spaced apart from the first protrusion 492a in the width direction of the housing (e.g., the second housing 422). In embodiments, the thickness of the protrusion 492 (e.g., the thickness of the first protrusion 492a and the thickness of the second protrusion 492b, and the length in the Z-axis direction) may be greater than the thickness of the flexible printed circuit board 460. For example, the thickness of the protrusion 492 (e.g., the thickness of the first protrusion 492a and the thickness of the second protrusion 492b) may be greater than the thickness of the second flat part 461c (e.g., the length in the Z-axis direction). In embodiments, the spacing distance (s2) between the first protrusion 492a and the second protrusion 492b may be greater than the width (w1) (e.g., the length in the Y-axis direction) of the flexible printed circuit board 460. In one embodiment, since the thickness of the first and second protrusions 492a and 492b and the spacing distance therebetween are greater than the thickness and width of the second flat par 461c, the second flat part 461c may be allowed to move in a movable space 490a formed by the second housing 422, the protrusion 492, and the reinforcing member 490. For example, the second flat part 461c may secure a space enabling the same to move in the movable space 490a in the width direction (e.g., the Y-axis direction) and/or the thickness direction (e.g., the Z-axis direction) of the second housing 422. In another embodiment, the movable space 490a may be understood as an element of the reinforcing member 490. For example, the reinforcing member 490 may include a first surface facing in the first direction (e.g., the −Z direction of FIG. 7), a second surface facing in the second direction (e.g., the +Z direction of FIG. 7) facing a direction opposite to the first direction, and the movable space 490a recessed in at least one part of the first surface toward the second direction. In another embodiment, the depth (e.g., the length in the Z-axis direction of FIG. 7) of the movable space 490a may be greater than the thickness of the flexible printed circuit board 460 (e.g., the thickness (e.g., the length in the Z-axis direction of FIG. 7)) of the second flat part 461c. In another embodiment, the width (e.g., the length in the Y-axis direction of FIG. 7) of the movable space 490a may be greater than the width of the flexible printed circuit board 460 (e.g., the width (e.g., the length in the Y-axis direction of FIG. 7) of the second flat part 461c).

Figure 8A:
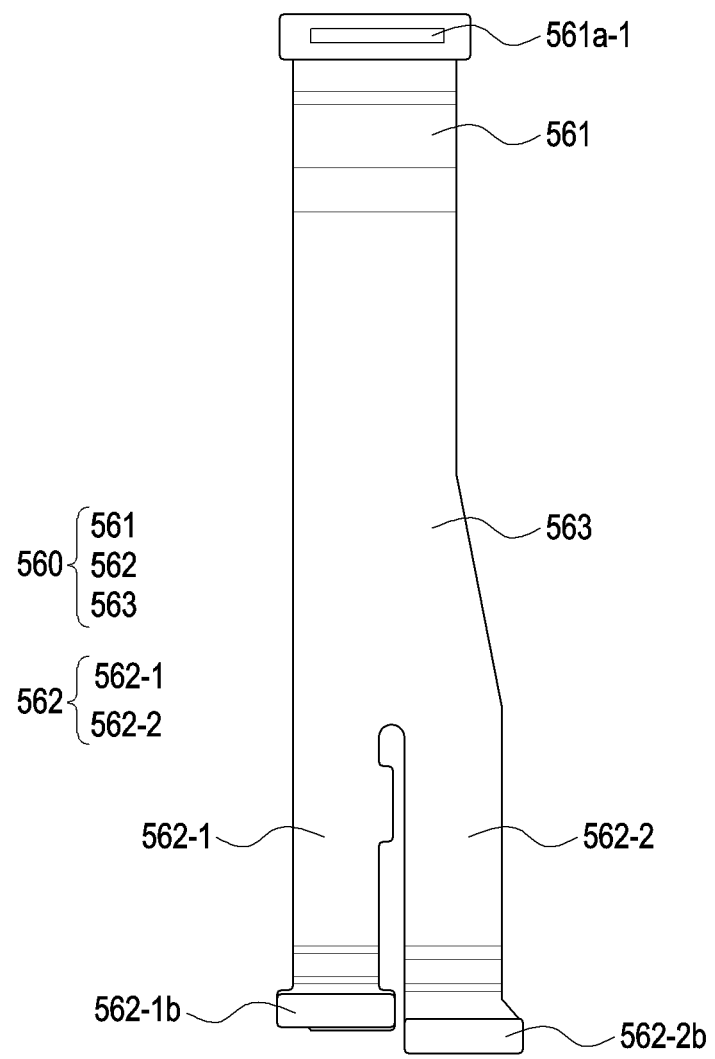
FIG. 8A is a front view of a flexible printed circuit board before a bending part of an electronic device is formed, according to an embodiment.
Figure 8B:
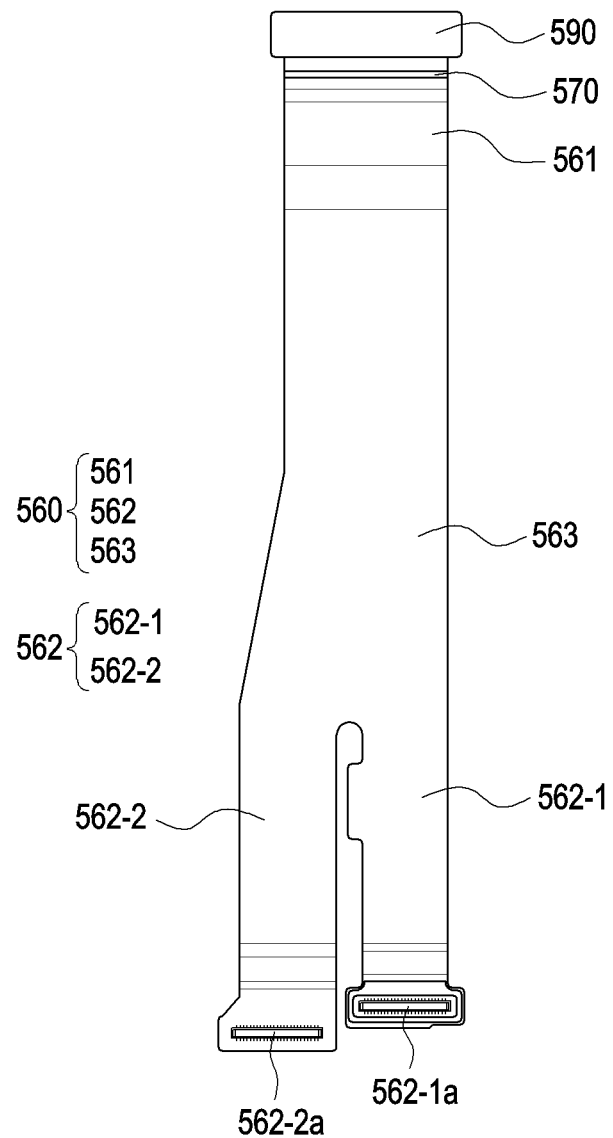
FIG. 8B is a rear view of a flexible printed circuit board before a bending part of an electronic device is formed, according to an embodiment.
Figure 8C:
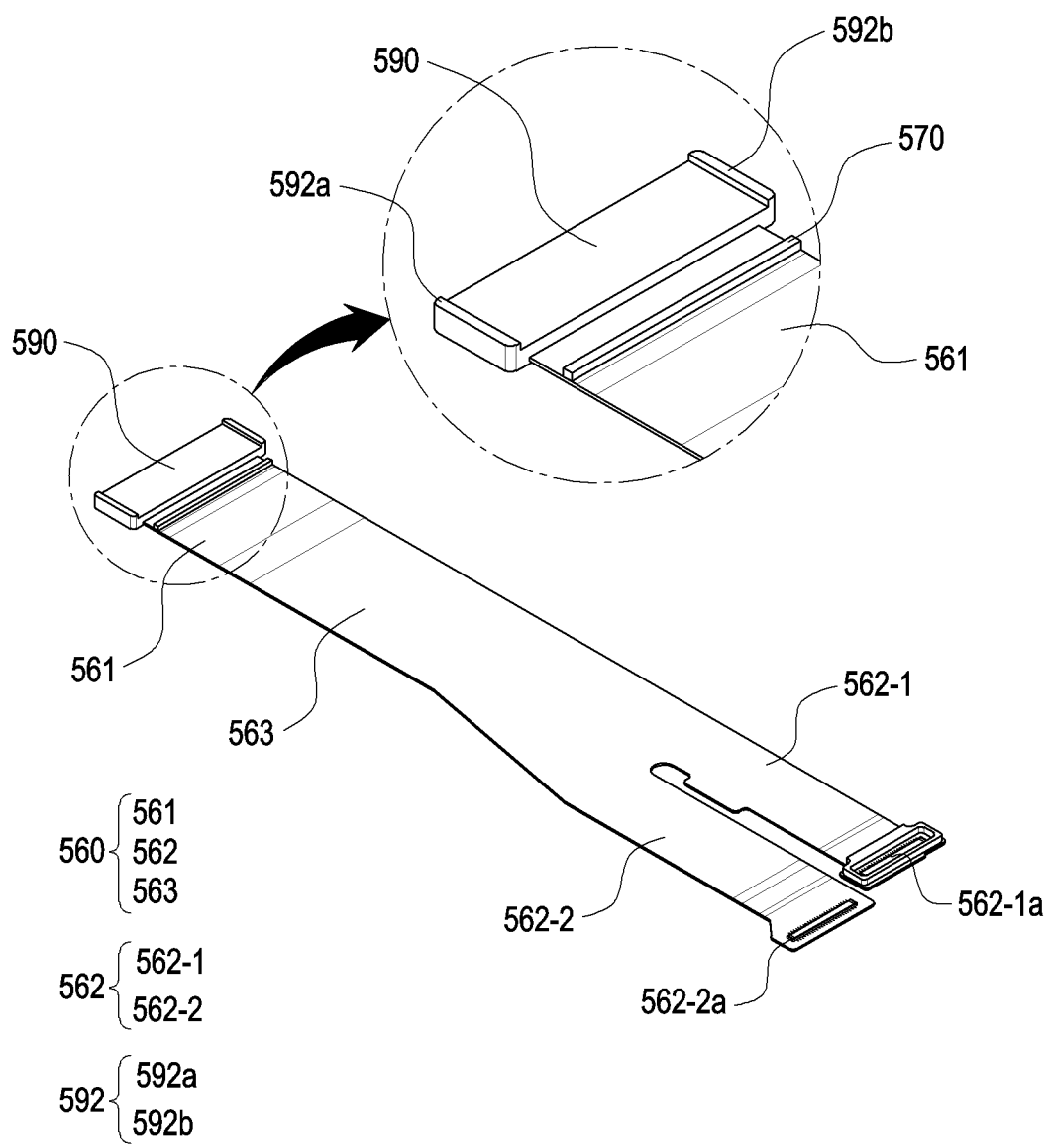
FIG. 8C is a rear perspective view of a flexible printed circuit board before a bending part of an electronic device is formed, according to an embodiment.

FIG. 8A is a front view of a flexible printed circuit board before a bending part of an electronic device is formed, according to various embodiments of the disclosure, FIG. 8B is a rear view of a flexible printed circuit board before a bending part of an electronic device is formed, according to various embodiments of the disclosure, and FIG. 8C is a rear perspective view of a flexible printed circuit board before a bending part of an electronic device is formed, according to various embodiments of the disclosure.

The configuration of the flexible printed circuit board 560 of FIGS. 8A to 8C may be partially or entirely the same as that of the flexible printed circuit board 360 of FIGS. 4 to 5 and/or the configuration of the flexible printed circuit board 460 of FIGS. 6 to 7. The configuration of the buffer member 570 of FIGS. 8A to 8C may be partially or entirely the same as that of the buffer member 470 of FIGS. 6 to 7. The configuration of the reinforcing member 590 of FIGS. 8A to 8C may be partially or entirely the same as that of the reinforcing member 490 of FIGS. 6 to 7.

According to various embodiments, the flexible printed circuit board 560 may include a first region 561, a second region 562, and/or a connection region 563.

In embodiments, the flexible printed circuit board 560 may include a first connector 561a-1 (e.g., the first connector 461a-1 of FIGS. 6 to 7) disposed on the front surface (e.g., the surface shown in FIG. 8A) of the first region 561 (e.g., the first region 361 of FIGS. 4 to 5). In one embodiment, the first connector 561a-1 may be electrically and/or physically connected to a first printed circuit board (e.g., the first printed circuit board 341 of FIGS. 4 to 5). In one embodiment, the first connector 561a-1 may be understood as at least a part of the flexible printed circuit board 560. In another embodiment, the first connector 561a-1 may be understood as a separate element from the flexible printed circuit board 560.

In embodiments, the reinforcing member 590 may be disposed on the rear surface (e.g., the surface shown in FIG. 8B, the surface facing the front surface) of the first region 561. In embodiments, the reinforcing member 590 may be formed as a separate member from the first region 561 to be attached to the first region 561. According to another embodiment, the reinforcing member 590 may be formed as a member integrated with the first region 561.

In embodiments, the connection region 563 (e.g., the connection region 363 of FIGS. 4 to 5) may connect the first region 561 and the second region 562. In embodiments, at least a part of the connection region 563 may face an electrical component (e.g., the battery 350 of FIGS. 4 to 5 and/or the battery module 450 of FIGS. 6A to 6B) inside the electronic device 101 (e.g., the electronic device 101 of FIGS. 1 to 7).

In embodiments, the second region 562 (e.g., the second region 362 of FIGS. 4 to 5) may include a region 562-1 (e.g., the region 362-1 of FIGS. 4 to 5) and/or a region 562-2 (e.g., the region 362-2 of FIGS. 4 to 5).

In embodiments, the flexible printed circuit board 560 may include a connector 562-1a disposed on the rear surface (e.g., the surface shown in FIG. 8B) of the region 562-1, and/or a connector 562-2a disposed on the rear surface (e.g., the surface shown in FIG. 8B) of the region 562-2. In embodiments, the connector 562-1a and the connector 562-2a may be electrically connected to a second printed circuit board (e.g., the second printed circuit board 342 of FIGS. 4 to 5). According to another embodiment, one of the connector 562-1a and the connector 562-2a may be connected to the second printed circuit board, and the other one may be connected to an electrical component different from the second printed circuit board. In an embodiment, the connector 562-la and the connector 562-2a may be understood as at least a part of the flexible printed circuit board 560. In another embodiment, the connector 562-la and/or the connector 562-2a may be understood as a separate configuration from the flexible printed circuit board 560.

In embodiments, a reinforcing member 562-1b may be disposed on the front surface (e.g., the surface shown in FIG. 8A) of the region 562-1. The reinforcing member 562-1b may have at least one part directly and/or indirectly supporting a housing (e.g., the second housing 422 of FIGS. 6 to 7), so that a spacing distance between the housing and the second printed circuit board can be maintained. In embodiments, the reinforcing member 562-1b may be formed as a separate member from the region 562-1 to be attached to the region 562-1. According to another embodiment, the reinforcing member 562-1b may be formed as a member integrated with the region 562-1.

In embodiments, a reinforcing member 562-2b may be disposed on the front surface (e.g., the surface shown in FIG. 8A) of the region 562-2. The reinforcing member 562-2b may have at least one part directly and/or indirectly supporting a housing (e.g., the second housing 422 of FIGS. 6 to 7), so that a spacing distance between the housing and the second printed circuit board can be maintained. In embodiments, the reinforcing member 562-2b may be formed as a separate member from the region 562-2 to be attached to the region 562-2. According to another embodiment, the reinforcing member 562-2b may be formed as a member integrated with the region 562-2.

In embodiments, the buffer member 570 (e.g., the buffer member 470 of FIGS. 6 to 7) may be disposed on the front surface (the surface shown in FIG. 8B) of the first region 561. The buffer member 570 may be disposed adjacent to the reinforcing member 590.

Referring to FIG. 8C, the reinforcing member 590 according to various embodiments may include a protrusion 592 (e.g., the protrusion 492 of FIG. 7) formed by at least one part thereof protruding farther than the other part thereof. In embodiments, the protrusion 592 may include a first protrusion 592a (e.g., the first protrusion 492a of FIG. 7) and/or a second protrusion 592b (e.g., the second protrusion 492b of FIG. 7) spaced apart from the first protrusion 592a.

Figure 9:
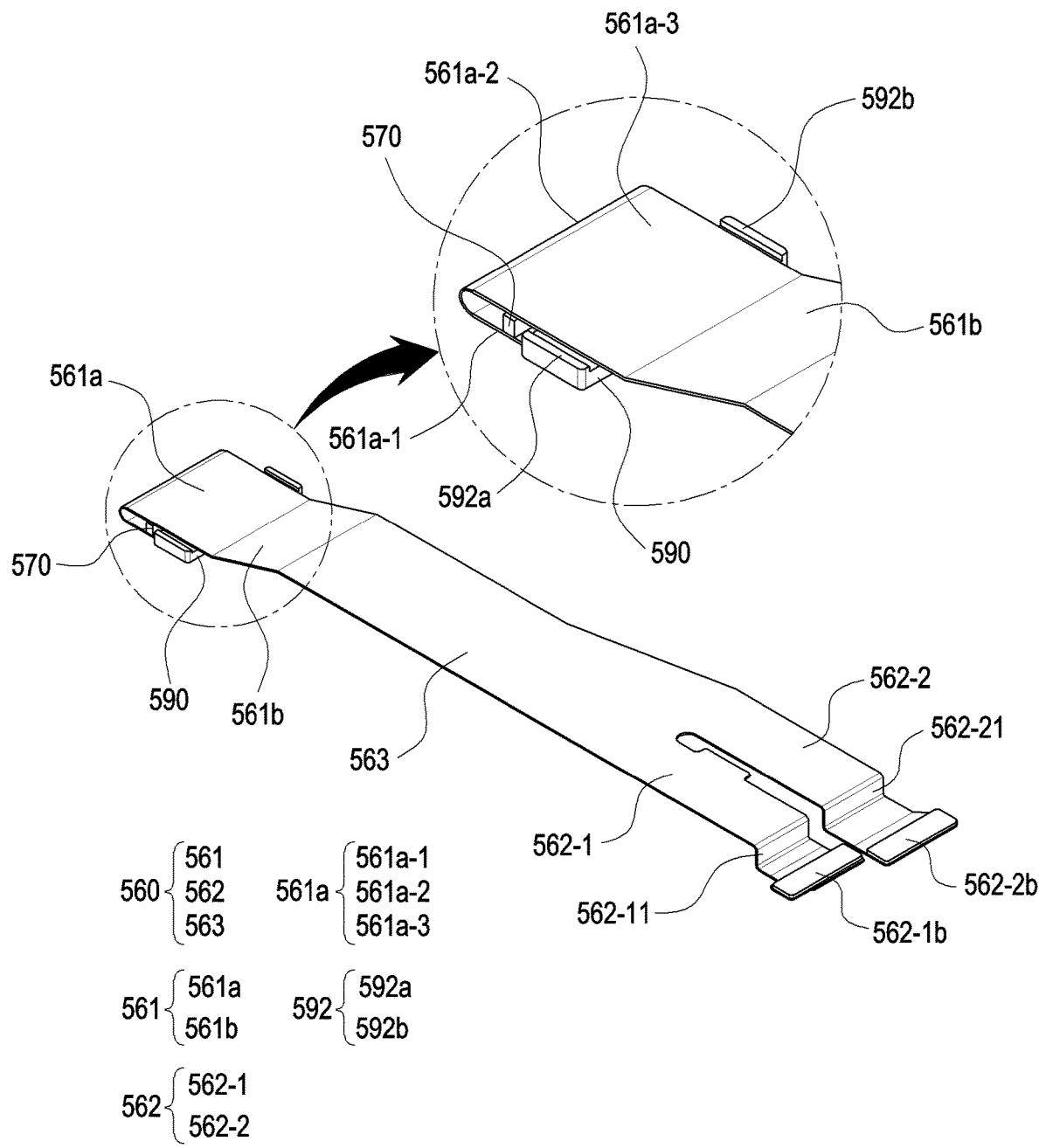
FIG. 9 is a perspective view of a flexible printed circuit board on which a bending part of an electronic device is formed, according to an embodiment.

FIG. 9 is a perspective view of a flexible printed circuit board on which a bending part of an electronic device is formed, according to various embodiments of the disclosure.

Referring to FIG. 9, the flexible printed circuit board 560 may include a first region 561, a second region 562, and/or a connection region 563.

The configuration of the first region 561, the second region 562, the connection region 563, the buffer member 570, and/or the reinforcing member 590 of FIG. 9 may be partially or entirely the same as that of the first region 561, the second region 562, the connection region 563, the buffer member 570, and/or the reinforcing member 590 of FIGS. 8A to 8C.

In embodiments, at least one part of the first region 561 may form a bending part 561a (e.g., the bending part 461 of FIGS. 6 to 7). For example, at least one part of the bending part 561a may have a shape which is convex in one direction. For example, the buffer member 570 may be disposed inside the bending part 561a. For example, at least one part of the reinforcing member 590 may be disposed inside the bending part 561a.

In embodiments, at least a part of the first region 561 may form a first inclined part 561b (e.g., the first inclined part 464 of FIGS. 6A to 6B). For example, the first inclined part 561b may be connected to the bending part 561a to form a predetermined angle with respect to the bending part 561a.

In embodiments, at least a part of the region 562-1 may form an inclined part 562-11. For example, the inclined part 562-11 may be connected to the connection region 563 to form a predetermined angle with respect to the connection region 563. In embodiments, the reinforcing member 562-1b may be disposed on at least a part of the region 562-1.

In embodiments, at least a part of the region 562-2 may form a inclined part 562-21. For example, the inclined part 562-21 may be connected to the connection region 563 to form a predetermined angle with respect to the connection region 563. In embodiments, the reinforcing member 562-2b may be disposed on at least a part of the region 562-2.

Hereinafter, a manufacturing and/or assembling process of the flexible printed circuit board will be described with reference to FIGS. 8 to 9.

FIG. 8 illustrates a state in which one or more elements are attached or coupled to a flexible printed circuit board before a bending part is formed, according to various embodiments of the disclosure. FIG. 9 illustrates a flexible printed circuit board having a bending part formed thereon, according to various embodiments of the disclosure.

As a first step, flexible printed circuit board 560 may have a first connector 561a-1 attached to or coupled to a first surface of a first region 561. As a second step, the flexible printed circuit board 560 may have a reinforcing member 590 attached or coupled to a second surface of the first region 561 facing in the direction opposite to the first surface. As a third step, the flexible printed circuit board 560 may have a buffer member 570 attached to or coupled to the second surface of the first region 561. As a fourth step, the flexible printed circuit board 560 may have a connector 562-la attached to or coupled to first surface of a region 562-1. As a fifth step, the flexible printed circuit board 560 may have a connector 562-2a attached to or coupled to first surface of a region 562-2. As a sixth step, the flexible printed circuit board 560 may have a reinforcing member 562-1b attached or coupled to the second surface of the region 562-1 facing in the direction opposite to the first surface. As a seventh step, the flexible printed circuit board 560 may have a reinforcing member 562-2b attached or coupled to the second surface of the region 562-2 facing in the direction opposite to the first surface.

According to an embodiment, the above-described first to seventh steps may be performed in the order described above. According to another embodiment, the above-described first to seventh steps may be performed in a random order. According to still another embodiment, the above-described first to seventh steps may be performed simultaneously.

As an eighth step, the flexible printed circuit board 560 may have the first region 561 at least partially bent to form a bending part 561a. As a ninth step, the flexible printed circuit board 560 may have the first region 561 at least partially bent to form a first inclined part 561b. As a tenth step, the flexible printed circuit board 560 may have the region 562-1 at least partially bent to form a inclined part 562-11. As an eleventh step, the flexible printed circuit board 560 may have the region 562-2 at least partially bent to form a inclined part 562-21.

In embodiments, the above-described eighth through eleventh steps may be performed in the order described above. According to another embodiment, the above-described eighth through eleventh steps may be performed in a random order. According to still another embodiment, the above-described eighth through eleventh steps may be performed simultaneously.

As a twelfth step, the flexible printed circuit board 560 may have a first connector 561a-1 electrically and/or physically connected to a first printed circuit board (e.g., the first printed circuit board 441 of FIGS. 6A to 6B). As a thirteenth step, the flexible printed circuit board 560 may have a connector 562-la electrically and/or physically connected to the second printed circuit board (e.g., the second printed circuit board 342 of FIGS. 4 to 5) or an electrical component. As a fourteenth step, the flexible printed circuit board 560 may have a connector 562-2a electrically and/or physically connected to an electrical component or the second printed circuit board.

In embodiments, the above-described twelfth to fourteenth steps may be performed in the order described above. According to another embodiment, the above-described twelfth to fourteenth steps may be performed in a random order. According to still another embodiment, the above-described twelfth to fourteenth steps may be performed simultaneously.

Figure 10:
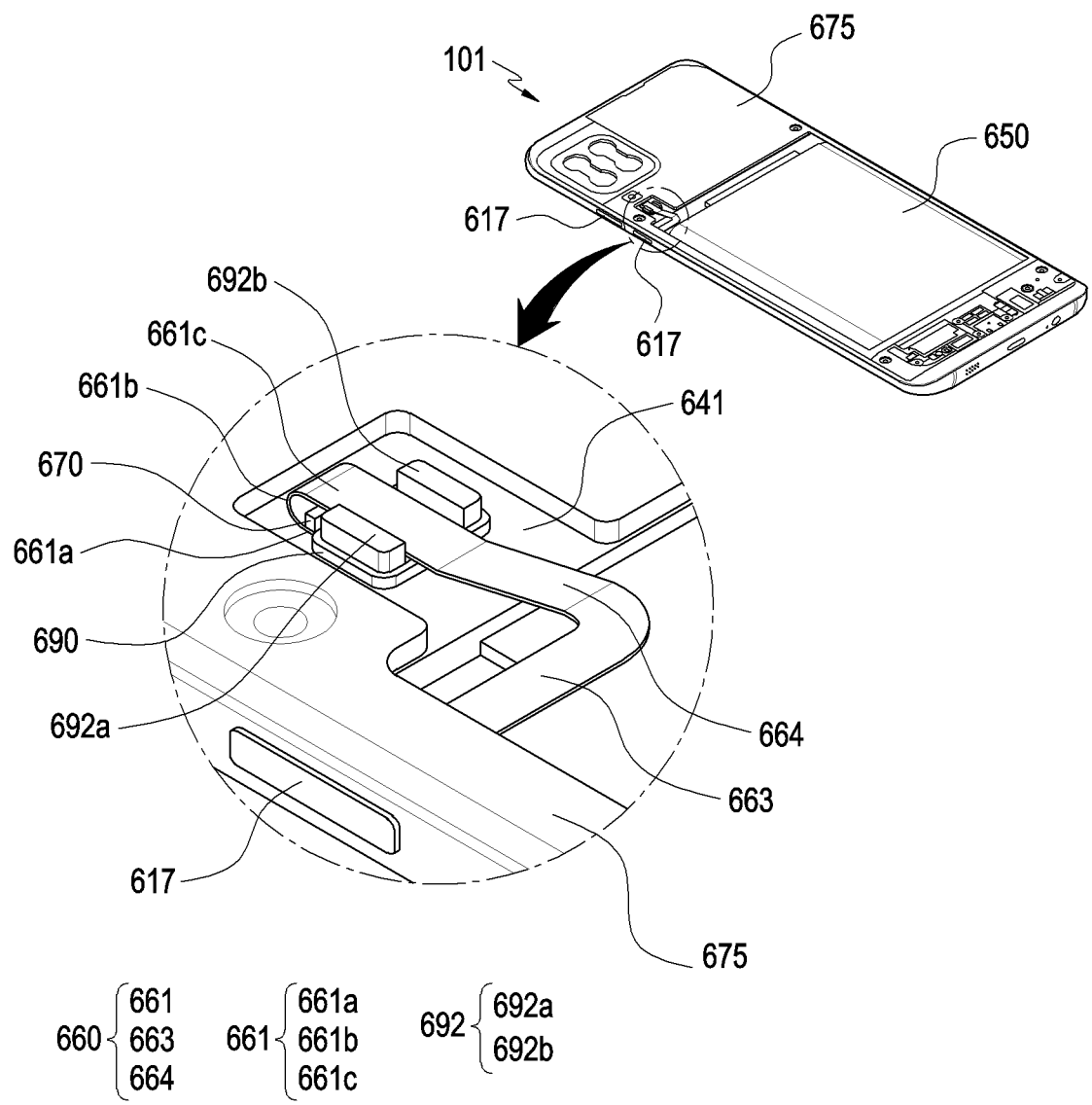
FIG. 10 is a perspective view illustrating a state in which a flexible printed circuit board and a printed circuit board of an electronic device are connected to each other, according to an embodiment.

FIG. 10 is a perspective view illustrating a state in which a flexible printed circuit board and a printed circuit board of an electronic device are connected to each other, according to various embodiments of the disclosure.

Referring to FIG. 10, the electronic device 101 may include a second support member 675, a key input device 617, a battery 650, a first printed circuit board 641, a flexible printed circuit board 660, a buffer member 670, and/or a reinforcing member 690.

The configuration of the second support member 675 of FIG. 10 may be partially or entirely the same as that of the second support member 375 of FIG. 4. The configuration of the key input device 617 of FIG. 10 may be partially or entirely the same as that of the key input device 317 of FIGS. 2 to 3. The configuration of the battery 650 and/or the first printed circuit board 641 of FIG. 10 may be partially or entirely the same as that of the battery 350 and/or the first printed circuit board 341 of FIG. 4. The configuration of the flexible printed circuit board 660 of FIG. 10 may be partially or entirely the same as that of the flexible printed circuit board 460 of FIGS. 6 to 7. The configuration of the buffer member 670 of FIG. 10 may be partially or entirely the same as that of the buffer member 470 of FIGS. 6A to 6B. The configuration of the reinforcing member 690 of FIG. 10 may be partially or entirely the same as that of the reinforcing member 490 of FIG. 7.

According to various embodiments, the flexible printed circuit board 660 may include a bending part 661, a first inclined part 664, and/or a third flat part 643.

In embodiments, the bending part 661 may include a first flat part 661a (e.g., the first flat part 461a of FIGS. 6A to 6B), a bent part 661b (e.g., the bent part 461b of FIGS. 6A to 6B), and/or a second flat part 661c (e.g., the second flat part 461c of FIGS. 6A to 6B). In embodiments, the first flat part 661a may include a first connector (e.g., the first connector 461a-1 of FIGS. 6A to 6B) to be electrically and/or physically connected to the first printed circuit board 641.

In embodiments, at least one part of the first inclined part 664 (e.g., the first inclined part 464 of FIGS. 6A to 6B) may face an electrical component (e.g., the battery 650). In embodiments, the first inclined part 664 may be inclined to form a predetermined angle with respect to the second flat part 661c.

In embodiments, the third flat part 663 (e.g., the third flat part 463 of FIGS. 6A to 6B) may be disposed to extend from the first inclined part 664 toward the second support member 675. In embodiments, the third flat part 663 may be electrically and/or physically connected to a second printed circuit board (e.g., the second printed circuit board 342 of FIGS. 4 to 5) electrically connected to the key input device 617. According to another embodiment, the third flat part 663 may be directly connected to the key input device 617.

In embodiments, at least one part of the reinforcing member 690 (e.g., the reinforcing member 490 of FIGS. 6A to 6B) may be disposed between the first flat part 661a and the second flat part 661c. For example, the reinforcing member 690 may be disposed on one surface (e.g., a surface facing the second flat part 661c) of the first flat part 661a. In embodiments, at least one part of the reinforcing member 690 may include a protrusion 692 (e.g., the protrusion 492 of FIG. 7) configured to support a housing (e.g., the second housing 422 of FIGS. 6A to 6B). In embodiments, the protrusion 692 may include a first protrusion 692a (e.g., the first protrusion 492a of FIG. 7), and a second protrusion 692b spaced apart from the first protrusion 692a (e.g., the second protrusion 492b of FIG. 7).

In embodiments, the buffer member 670 (e.g., the buffer member 470 of FIGS. 6A to 6B) may be disposed on one surface (e.g., a surface facing the second flat part 661c) of the first flat part 661a. According to another embodiment, the buffer member 670 may be disposed on one surface (e.g., a surface facing the first flat part 661a) of the second flat part 661c. According to still another embodiment, the buffer member 670 may be disposed on one surface (e.g., a surface facing the bent part 662b) of the reinforcing member 690.

Referring to FIG. 10, in the electronic device 101 of the disclosure, even when an external force acts on the flexible printed circuit board 660 by use of the key input device 617 and/or movement of an electrical component (e.g., the battery 650), at least one part of the bent part 661b and/or the first flat part 661a of the flexible printed circuit board 660 may be bent, and accordingly, the escape of the first connector from the first printed circuit board 641 may be restricted.

Figure 11A:
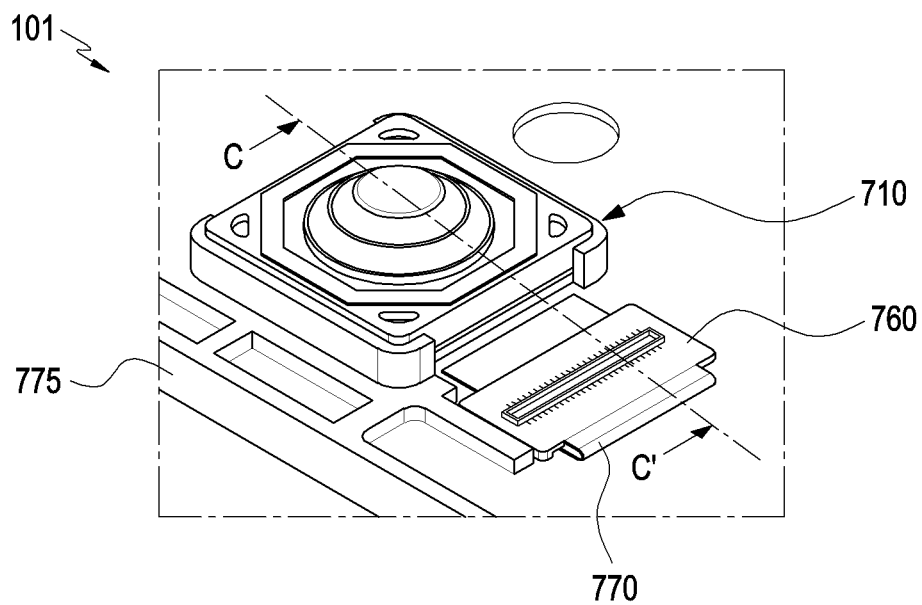
FIG. 11A is a perspective view illustrating a state in which an electrical component and a flexible printed circuit board of an electronic device are connected to each other, according to an embodiment.
Figure 11B:
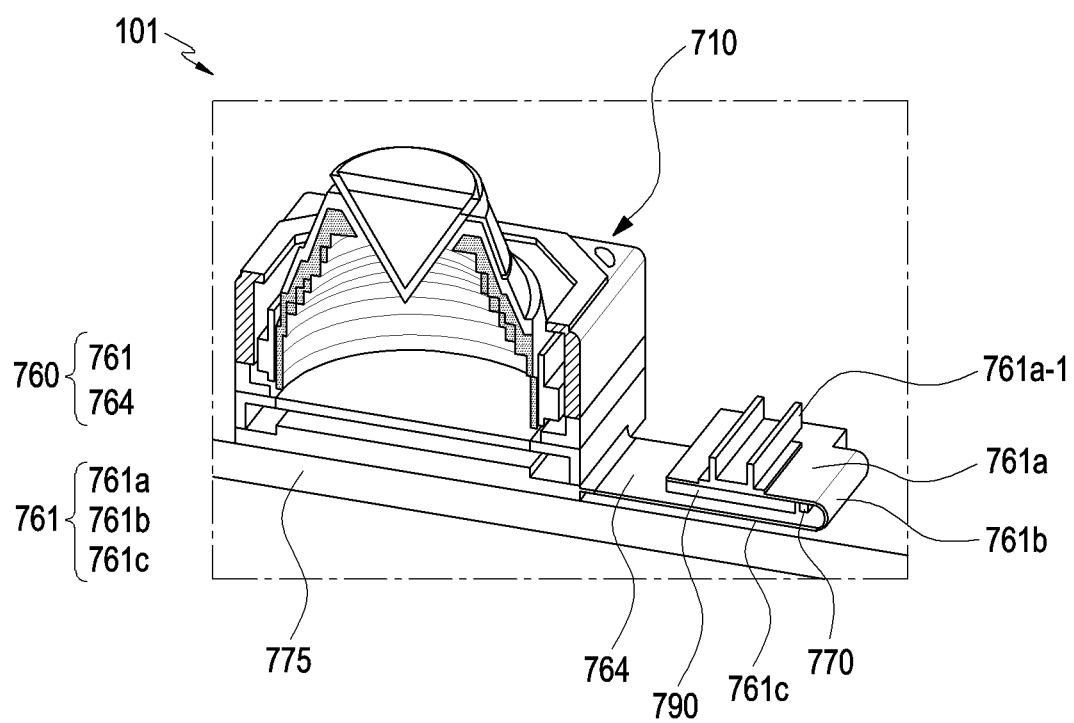
FIG. 11B is a cross-sectional perspective view taken along line C-C' of FIG. 11A, according to an embodiment.

FIG. 11A is a perspective view illustrating a state in which an electrical component and a flexible printed circuit board of an electronic device are connected to each other, according to various embodiments of the disclosure. FIG. 11B is a cross-sectional perspective view taken along line C-C' of FIG. 11A, according to various embodiments of the disclosure.

Referring to FIGS. 11A to 11B, the electronic device 101 (e.g., the electronic device 101 of FIGS. 1 to 4) according to various embodiments may include an electrical component, a second support member 775, and a flexible printed circuit board 760, a buffer member 770, and/or a reinforcing member 790.

The configuration of the second support member 775 of FIGS. 11A to 11B may be partially or entirely the same as that of the second support member 375 of FIG. 4. The configuration of the flexible printed circuit board 760 of FIGS. 11A to 11B may be partially or entirely the same as that of the flexible printed circuit board 460 of FIGS. 6 to 7. The configuration of the buffer member 770 of FIGS. 11A to 11B may be partially or entirely the same as that of the buffer member 470 of FIGS. 6A to 6B. The configuration of the reinforcing member 790 of FIGS. 11A to 11B may be partially or entirely the same as that of the reinforcing member 490 of FIG. 7.

According to various embodiments, the flexible printed circuit board 760 may include a bending part 761 and/or a third flat part 764.

In embodiments, the bending part 761 may include a first flat part 761a (e.g., the first flat part 461a of FIGS. 6A to 6B), a bent part 761b (e.g., the bent part 461b of FIGS. 6A to 6B), and/or a second flat part 761c (e.g., the second flat part 461c of FIGS. 6A to 6B). In embodiments, the first flat part 761a may include a first connector 761a-1 to be electrically and/or physically connected to the first printed circuit board (e.g., the first printed circuit board 341 of FIGS. 4 to 5).

In embodiments, the third flat part 764 may extend from the second flat part 761*c* to be connected to an electrical component (e.g., the camera 710).

In embodiments, the electrical component (e.g., the camera 710) may be supported by the second support member 775. In embodiments, the camera 710 (e.g., the camera module 180 of FIG. 1) may be electrically and/or physically connected to the flexible printed circuit board 760. According to another embodiment, the camera 710 may be electrically connected to the flexible printed circuit board 760 through the second printed circuit board (e.g., the second printed circuit board 342 of FIGS. 4 to 5).

In embodiments, at least one part of the reinforcing member 790 (e.g., the reinforcing member 490 of FIGS. 6A to 6B) may be disposed between the first flat part 761*a* and the second flat part 761*c*. For example, the reinforcing member 790 may be disposed on one surface (e.g., a surface facing the second flat part 761*c*) of the first flat part 761*a*. In embodiments, at least one part of the reinforcing member 690 may include a protrusion (e.g., the protrusion 492 of FIG. 7) supporting a housing (e.g., the first housing 421 of FIGS. 6A to 6B).

In embodiments, the buffer member 770 (e.g., the buffer member 470 of FIGS. 6A to 6B) may be disposed on one surface (e.g., a surface facing the second flat part 761*c*) of the first flat part 761*a*. According to another embodiment, the buffer member 770 may be disposed on one surface (e.g., a surface facing the first flat part 761*a*) of the second flat part 761*c*. According to still another embodiment, the buffer member 770 may be disposed on one surface (e.g., a surface facing the bent part 762*b*) of the reinforcing member 790.

Referring to FIGS. 11A-11B, in the electronic device 101 of the disclosure, even when an external force acts on the flexible printed circuit board 760 by the movement of the electrical component (e.g., the camera 710), at least one part of the bent part 761*b* and/or the first flat part 761*a* of the flexible printed circuit board 760 may be bent, and accordingly, the escape of the first connector 761*a*-1 from the first printed circuit board may be restricted.

Figure 12:
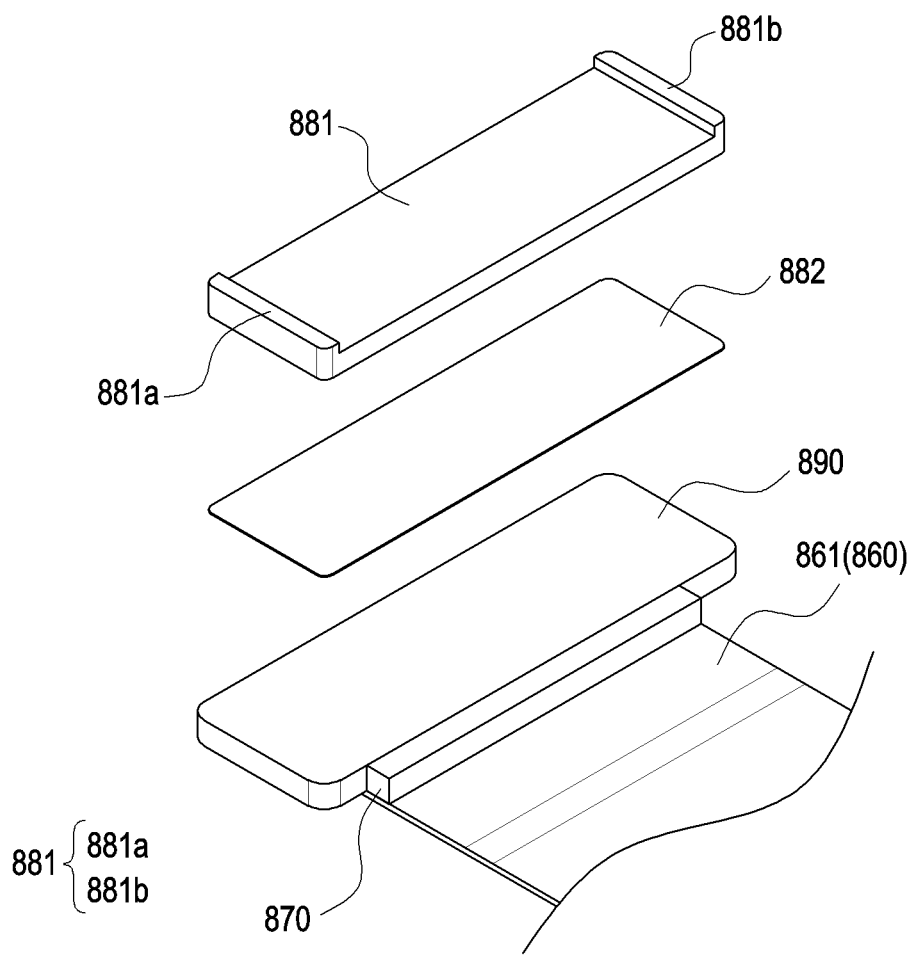
FIG. 12 is an exploded perspective view illustrating a reinforcing member, a protrusion, and an attachment member of an electronic device according to an embodiment.

FIG. 12 is an exploded perspective view illustrating a reinforcing member, a protrusion, and an attachment member of an electronic device according to various embodiments of the disclosure.

The configuration of a flexible printed circuit board 860, a buffer member 870, and/or a reinforcing member 890 of FIG. 12 may be partially or entirely the same as that of the flexible printed circuit board 560, the buffer member 570, and/or the reinforcing member 590 of FIGS. 8A to 8C.

According to various embodiments, the buffer member 870 and/or the reinforcing member 890 may be disposed on one surface of the first region 861 (e.g., the first region 561 of FIGS. 8A to 8C) of the flexible printed circuit board 860.

In embodiments, a protrusion member 881 may be coupled to one surface (e.g., a surface of the reinforcing member 890 facing in a direction opposite to the surface coupled to the first region 861) of the reinforcing member 890. In embodiments, at least one part of the protrusion member 881 may include a first protrusion 881*a* (e.g., the first protrusion 492*a* of FIG. 7) configured to support a housing (e.g., the second housing 422 of FIGS. 6A to 6B), and/or a second protrusion 881*b* (e.g., the second protrusion 492*b* of FIG. 7) spaced apart from the first protrusion 881*a*. In embodiments, the protrusion member 881 may be coupled to first surface of the reinforcing member 890 through the attachment member 882. For example, the attachment member 882 may include a tape. As another example, the attachment member 882 may include various members for attaching the reinforcing member 890 and the protrusion member 881.

Figure 13:
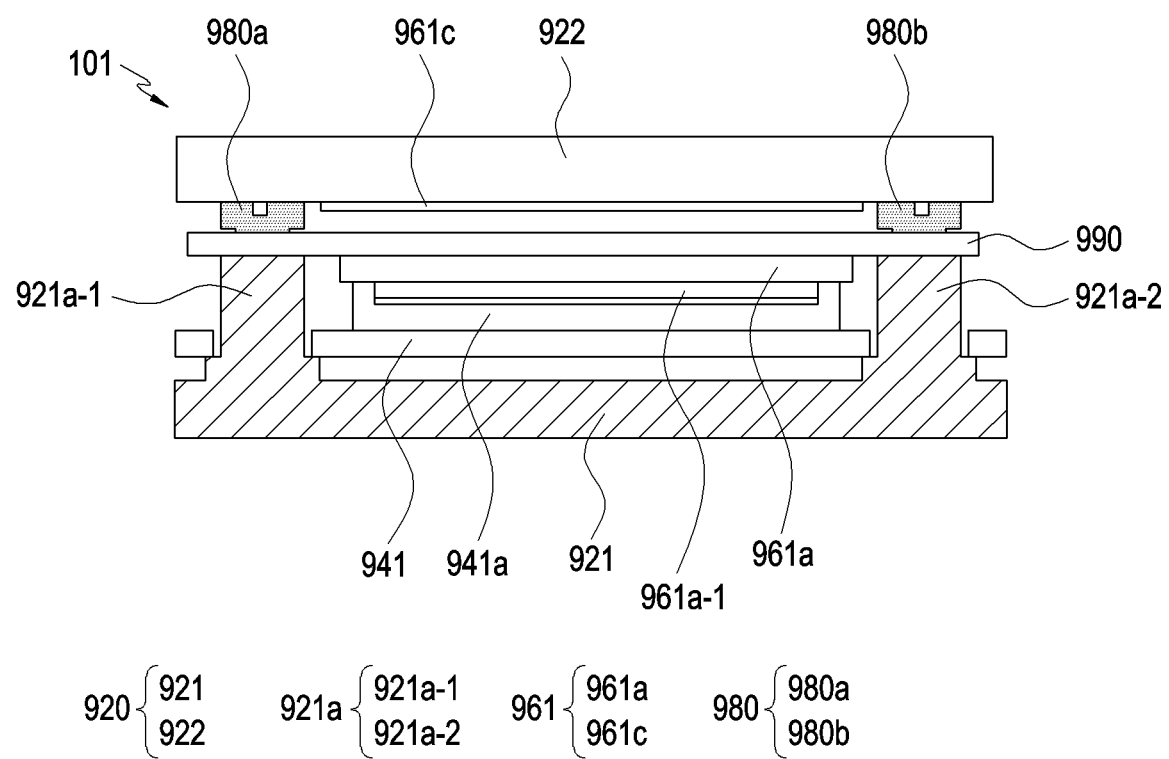
FIG. 13 is a cross-sectional view illustrating an arrangement relationship between a printed circuit board, a reinforcing member, and a flexible printed circuit board of an electronic device, according to an embodiment.

FIG. 13 is a cross-sectional view illustrating an arrangement relationship between a printed circuit board, a reinforcing member, and a flexible printed circuit board of an electronic device, according to various embodiments of the disclosure.

Referring to FIG. 13, the electronic device 101 (e.g., the electronic device 101 of FIGS. 1 to 4) may include a housing 920, a first printed circuit board 941, a flexible printed circuit board 960, a reinforcing member 990, and/or a protrusion member 980.

The configuration of the housing 920 of FIG. 13 may be partially or entirely the same as that of the housing 420 of FIGS. 6A to 6B. The configuration of the first printed circuit board 941 of FIG. 13 may be partially or entirely the same as that of the first printed circuit board 441 of FIGS. 6A to 6B. The configuration of the reinforcing member 990 of FIG. 13 may be partially or entirely the same as that of the reinforcing member 890 of FIG. 12.

According to various embodiments, the flexible printed circuit board 960 may include a bending part 961.

In embodiments, the bending part 961 may include a first flat part 961*a* (e.g., the first flat part 461*a* of FIGS. 6A to 6B), a bent part (e.g., the bent part 461*b* of FIGS. 6A to 6B), and/or a second flat part 961*c* (e.g., the second flat part 461*c* of FIGS. 6A to 6B). In embodiments, the first flat part 961*a* may include a first connector 961*a*-1 (e.g., the first connector 461*a*-1 of FIGS. 6A to 6B) to be electrically and/or physically connected to a third connector 941*a* (e.g., the third connector 441*a* of FIGS. 6A to 6B) of the first printed circuit board 941 (e.g., the first printed circuit board 441 of FIGS. 6A to 6B).

In embodiments, the housing 920 may include a first housing 921 (e.g., the first housing 421 of FIGS. 6A to 6B) and/or a second housing 922 (e.g., the second housing 422 of FIGS. 6A to 6B) spaced apart from the first housing 921. In embodiments, at least one part of the first housing 921 may include a support member 921*a* (e.g., the support member 421*a* of FIGS. 6A to 6B) configured to support the first printed circuit board 941 and/or the reinforcing member 990. In embodiments, the support member 921*a* may include a first region support member 921*a*-1 and/or a second region support member 921*a*-2 spaced apart from the first region support member 921*a*-1.

In embodiments, at least one part of the reinforcing member 990 may be disposed between the first flat part 961*a* and the second flat part 961*c*. For example, at least one part of the reinforcing member 990 may be disposed on a first surface (e.g., a surface facing the second flat part 961*c*) of the first flat part 961*a*.

In embodiments, the protrusion member 980 may pass through the reinforcing member 990 to be coupled to the support member 921*a* such that the reinforcing member 990 is fixed to the support member 921*a*. In embodiments, at least one part of the protrusion member 980 may support the second housing 922. In embodiments, the protrusion member 980 may include a first protrusion member 980*a* configured to fix one region of the reinforcing member 990 to the first region support member 921*a*-1, and/or a second protrusion member 980*b* configured to fix the other region of the reinforcing member 990 to the second region support member 921*a*-2. For example, the first protrusion member 980*a* and/or the second protrusion member 980*b* may include a bolt. As another example, the first protrusion member 980*a* and/or the second protrusion member 980*b* may include a pin. As still another example, the first protrusion member 980a and/or the second protrusion member 980b may include various members that allow the reinforcing member 990 to be fixed to the support member 921.

In embodiments, at least one part (e.g., the second flat part 961c) of the flexible printed circuit board 960 may secure a space enabling movement in a movable space (e.g., the movable space 490a of FIG. 7) formed by the second housing 922, the protrusion member 980, and/or the reinforcing member 990.

According to various embodiments of the disclosure, an electronic device (e.g., the electronic device 101 of FIG. 1) may include a housing (e.g., the housing 420 of FIGS. 6A to 6B), a first printed circuit board (e.g., the first printed circuit board 341 of FIG. 4) disposed in the housing, a second printed circuit board (e.g., the second printed circuit board 342 of FIG. 4) disposed in the housing, a flexible printed circuit board (e.g., the flexible printed circuit board 460 of FIGS. 6A to 6B) configured to electrically connect the first printed circuit board to the second printed circuit board, the flexible printed circuit board including a first connector (e.g., the first connector 461a-1 of FIGS. 6A to 6B) connected to the first printed circuit board, a second connector (e.g., the connector 562-1a or the connector 562-2a of FIGS. 8A to 8C) connected to the second printed circuit board, and a bending part (e.g., the bending part 461 of FIGS. 6A to 6B) extending from the first connector in a direction away from the second printed circuit board and then bent so as to extend toward the second printed circuit board, an electrical component (e.g., the battery module 450 of FIGS. 6A to 6B) disposed in the housing wherein at least a portion of the electrical component faces the flexible printed circuit board, and a buffer member (e.g., the buffer member 470 of FIG. 7) disposed between a first portion (e.g., the first flat part 461a of FIGS. 6A to 6B) of the bending part and a second portion (e.g., the second flat part 461c of FIGS. 6A to 6B) of the bending part facing the first portion of the bending part.

According to various embodiments, the electronic device may further include a reinforcing member (e.g., the reinforcing member 490 of FIG. 7) coupled to a first surface of the flexible printed circuit board opposite to a second surface to which the first connector is coupled, wherein the reinforcing member may include a protrusion (e.g., the protrusion 492 of FIG. 7) configured to support the housing.

According to various embodiments, a thickness of the protrusion may be greater than a thickness of the flexible printed circuit board.

According to various embodiments, the protrusion may include a first protrusion (e.g., the first protrusion 492a of FIG. 7) and a second protrusion (e.g., the second protrusion 492b of FIG. 7) spaced apart from the first protrusion in the width direction of the housing, and a distance (e.g., the spacing distance (s2) of FIG. 7) between the first protrusion and the second protrusion may be greater than a width (e.g., the width (w1) of FIG. 7) of the flexible printed circuit board.

According to various embodiments, the bending part may include a first flat part (e.g., the first flat part 461a of FIGS. 6A to 6B) extending from the first connector in a direction away from the second printed circuit board, a bent part (e.g., a bent part 461b of FIGS. 6A to 6B) bent from the first flat part toward the second printed circuit board, and a second flat part (e.g., the second flat part 461c of FIGS. 6A to 6B) extending from the bent part toward the second printed circuit board.

According to various embodiments, the buffer member may be disposed on one of the first flat part and the second flat part.

According to various embodiments, the second flat part may be substantially parallel to the first flat part.

According to various embodiments, the bending part may include a first flat part extending from the first connector in a direction away from the second printed circuit board, a bent part bent from the first flat part toward the second printed circuit board, and a second flat part extending from the bent part toward the second printed circuit board, and the buffer member may be disposed on a part of the reinforcing member facing the bent part.

According to various embodiments, the electrical component may include at least one of a battery (e.g., the battery module 450 of FIGS. 6A to 6B) and a camera (e.g., the camera 710 of FIGS. 11A to 11B).

According to various embodiments, a height (e.g., the height (h1) of FIGS. 6A to 6B) of the buffer member may be less than a distance between the first flat part and the second flat part (e.g., the spacing distance (s1) of FIGS. 6A to 6B).

According to various embodiments, the protrusion may be formed integrally with the reinforcing member.

According to various embodiments, the protrusion may be formed separately from the reinforcing member.

According to various embodiments, the protrusion may be coupled to the reinforcing member through an attachment member (e.g., the attachment member 882 of FIG. 12).

According to various embodiments, the protrusion may pass through the reinforcing member to be coupled to the housing.

According to various embodiments, the flexible printed circuit board may include a first inclined part (e.g., the first inclined part 464 of FIGS. 6A to 6B) extending from the second flat part in a direction away from the electrical component, and a third flat part (e.g., the third flat part 463 of FIGS. 6A to 6B) extending from the first inclined part toward the second printed circuit board.

According to various embodiments of the disclosure, an electronic device (e.g., the electronic device 101 of FIG. 1) may include a housing (e.g., the housing 420 of FIGS. 6A to 6B), a first printed circuit board (e.g., the first printed circuit board 441 of FIGS. 6A to 6B) disposed in the housing, a flexible printed circuit board (e.g., the flexible printed circuit board 460 of FIGS. 6A to 6B) electrically connected to the first printed circuit board, the flexible printed circuit board including a first connector (e.g., the first connector 461a-1 of FIGS. 6A to 6B) coupled to the first printed circuit board, and a bending part (e.g., the bending part 461 of FIGS. 6A to 6B) extending in a first direction from the first connector and then bent to extend in a second direction opposite to the first direction, an electrical component (e.g., the battery module 450 of FIGS. 6A to 6B) disposed in the housing and wherein at least a portion of the electrical component faces the flexible printed circuit board, a reinforcing member (e.g., the reinforcing member 490 of FIG. 7) coupled to a first surface of the flexible printed circuit board opposite to a second surface to which the first connector is coupled, at least one part of the reinforcing member including a protrusion (e.g., the protrusion 492 of FIG. 7) configured to support the housing, and a buffer member (e.g., the buffer member 470 of FIGS. 6A to 6B) disposed inside the bending part and disposed adjacent to the reinforcing member.

According to various embodiments, the reinforcing member may include a first surface facing in a first direction, a second surface facing in a second direction opposite to the first direction, and a movable space (e.g., the movable space 490a of FIG. 7) formed on at least one part of the first surface to be recessed in the second direction, and a depth of the movable space may be greater than a thickness of the flexible printed circuit board.

According to various embodiments, a width of the movable space may be greater than a width of the flexible printed circuit board.

According to various embodiments, the bending part may include a first flat part (e.g., the first flat part 461a of FIGS. 6A to 6B) extending in a first direction from the first connector, a bent part (e.g., the bent part 461b of FIGS. 6A to 6B) bent from the first flat part toward a second direction opposite to the first direction, and a second flat part (e.g., the second flat part 461c of FIGS. 6A to 6B) extending from the bent part toward the second direction.

According to various embodiments of the disclosure, an electronic device (e.g., the electronic device 101 of FIG. 1) may include a housing (e.g., the housing 420 of FIGS. 6A to 6B), a first printed circuit board (e.g., the first printed circuit board 441 of FIGS. 6A to 6B) disposed in the housing, a flexible printed circuit board (e.g., the flexible printed circuit board 460 of FIGS. 6A to 6B) electrically connected to the first printed circuit board, the flexible printed circuit board including a first connector (e.g., the first connector 461a-1 of FIGS. 6A to 6B) connected to the first printed circuit board, and a bending part (e.g., the bending part 461 of FIGS. 6A to 6B) extending in a first direction from the first connector and then bent to extend in a second direction opposite to the first direction, an electrical component (e.g., the battery module 450 of FIGS. 6A to 6B) disposed adjacent to the first printed circuit board wherein at least a portion of the electrical component faces the flexible printed circuit board, and a buffer member (e.g., the buffer member 470 of FIGS. 6A to 6B) disposed inside the bending part, and the bending part may include a first flat part (e.g., the first flat part 461a of FIGS. 6A to 6B) extending substantially parallel to the first printed circuit board from the first connector, a bent part (e.g., a bent part 461b of FIGS. 6A to 6B) bent to extend from the first flat part toward the first connector, and a second flat part (e.g., the second flat part 461c of FIGS. 6A to 6B) extending substantially parallel to the first printed circuit board from the bent part.

As mentioned above, although specific embodiments have been described in the detailed description of the disclosure, it will be apparent to those of ordinary skill in the art that various modifications are possible without departing from the scope of the disclosure.

What is claimed is:

1. An electronic device comprising:
   a housing;
   a first printed circuit board disposed in the housing;
   a second printed circuit board disposed in the housing;
   a flexible printed circuit board configured to electrically connect the first printed circuit board to the second printed circuit board, the flexible printed circuit board comprising:
      a first connector connected to the first printed circuit board,
      a second connector connected to the second printed circuit board, and
      a bending part which extends from the first connector away from the second printed circuit board and bends to extend toward the second printed circuit board;
   an electrical component disposed in the housing, wherein at least a portion of the electrical component faces the flexible printed circuit board;
   a buffer member disposed between a first portion of the bending part and a second portion of the bending part which faces the first portion of the bending part; and
   a reinforcing member on a first surface of the flexible printed circuit board,
   wherein the reinforcing member comprises a first protrusion and a second protrusion spaced apart from the first protrusion in a width direction of the housing, and
   wherein at least a portion of the flexible printed circuit board is accommodated in a recess defined by the reinforcing member, the first protrusion, and the second protrusion.

2. The electronic device of claim 1, wherein the reinforcing member is coupled to a first surface of the flexible printed circuit board opposite to a second surface of the flexible printed circuit board, and
   wherein the first connector is coupled to the second surface of the printed circuit board.

3. The electronic device of claim 2, wherein a thickness of each of the first protrusion and the second protrusion is greater than a thickness of the flexible printed circuit board.

4. The electronic device of claim 2,
   wherein a distance between the first protrusion and the second protrusion is greater than a width of the flexible printed circuit board.

5. The electronic device of claim 2, wherein the bending part comprises:
   the first portion, which extends from the first connector away from the second printed circuit board,
   a bent part which bends from the first portion toward the second printed circuit board, and
   the second portion, which extends from the bent part toward the second printed circuit board, and
   wherein the buffer member is disposed on a portion of the reinforcing member which faces the bent part.

6. The electronic device of claim 5, wherein a height of the buffer member is less than a distance between the first portion and the second portion.

7. The electronic device of claim 2, wherein the first protrusion and the second protrusion are formed integrally with the reinforcing member.

8. The electronic device of claim 2, wherein the first protrusion and the second protrusion are formed separately from the reinforcing member.

9. The electronic device of claim 8, wherein the first protrusion and the second protrusion are coupled to the reinforcing member using an attachment member.

10. The electronic device of claim 8, wherein first protrusion and the second protrusion pass through the reinforcing member and are coupled to the housing.

11. The electronic device of claim 1, wherein the bending part comprises:
    the first portion, which extends from the first connector away from the second printed circuit board,
    a bent part which bends from the first portion toward the second printed circuit board, and
    the second portion, which extends from the bent part toward the second printed circuit board.

12. The electronic device of claim 11, wherein the buffer member is disposed on one part from among the first portion and the second portion.

13. The electronic device of claim 11, wherein the second portion is parallel to the first portion.

14. The electronic device of claim 11, wherein the flexible printed circuit board comprises a first inclined part which extends from the second portion away from the electrical component, and a third portion which extends from the first inclined part toward the second printed circuit board.

15. The electronic device of claim 1, wherein the electrical component comprises at least one of a battery and a camera.

16. An electronic device comprising:
a housing;
a first printed circuit board disposed in the housing;
a flexible printed circuit board electrically connected to the first printed circuit board, the flexible printed circuit board comprising:
  a first connector coupled to the first printed circuit board, and
  a bending part which extends from the first connector and bends to extend toward the first connector;
an electrical component disposed in the housing, and wherein at least a portion of the electrical component faces the flexible printed circuit board;
a reinforcing member coupled to a first surface of the flexible printed circuit board opposite to a second surface of the flexible printed circuit board, wherein the first connector is coupled to the second surface of the flexible printed circuit board, and wherein the reinforcing member comprises a plurality of protrusions configured to support the housing; and
a buffer member disposed inside the bending part and adjacent to the reinforcing member,
wherein the plurality of protrusions comprises a first protrusion and a second protrusion spaced apart from the first protrusion in a width direction of the housing, and
wherein at least a portion of the flexible printed circuit board is accommodated in a recess defined by the reinforcing member, the first protrusion, and the second protrusion.

17. The electronic device of claim 16, wherein a first surface of the reinforcing member faces in a first direction,
wherein a second surface of the reinforcing member faces in a second direction opposite to the first direction, and
wherein a movable space formed in at least one portion of the first surface of the reinforcing member is recessed in the second direction, and
wherein a depth of the movable space is greater than a thickness of the flexible printed circuit board.

18. The electronic device of claim 17, wherein a width of the movable space is greater than a width of the flexible printed circuit board.

19. The electronic device of claim 16, wherein the bending part comprises:
the first portion, which extends from the first connector,
a bent part which bends from the first portion toward the first connector, and
the second portion, which extends from the bent part toward the first connector.

20. An electronic device comprising:
a housing;
a first printed circuit board disposed in the housing;
a flexible printed circuit board electrically connected to the first printed circuit board, the flexible printed circuit board comprising:
  a first connector connected to the first printed circuit board, and
  a bending part which extends in a first direction from the first connector, and bends to extend in a second direction opposite to the first direction;
an electrical component disposed adjacent to the first printed circuit board, wherein at least a portion of the electrical component faces the flexible printed circuit board; and
a buffer member and a reinforcing member disposed inside the bending part,
wherein the bending part comprises:
  a first portion which extends substantially parallel to the first printed circuit board from the first connector,
  a bent part which bends to extend from the first portion toward the first connector, and
  a second portion which extends substantially parallel to the first printed circuit board from the bent part,
wherein the reinforcing member comprises a first protrusion and a second protrusion spaced apart from the first protrusion in a width direction of the housing, and
wherein at least a portion of the flexible printed circuit board is accommodated in a recess defined by the reinforcing member, the first protrusion, and the second protrusion.

* * * * *